(12) United States Patent
Morii

(10) Patent No.: US 11,101,109 B2
(45) Date of Patent: Aug. 24, 2021

(54) IMPEDANCE MATCHING DEVICE AND IMPEDANCE MATCHING METHOD

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 16/722,731

(22) Filed: Dec. 20, 2019

(65) Prior Publication Data

US 2020/0211824 A1 Jul. 2, 2020

(30) Foreign Application Priority Data

Dec. 27, 2018 (JP) .............................. JP2018-245077

(51) Int. Cl.
*H01J 37/32* (2006.01)
*H03H 7/38* (2006.01)

(52) U.S. Cl.
CPC ......... *H01J 37/32183* (2013.01); *H03H 7/38* (2013.01)

(58) Field of Classification Search
CPC ............................... H01J 7/32183; H03H 7/38
See application file for complete search history.

(56) References Cited

U.S. PATENT DOCUMENTS

| | | | |
|---|---|---|---|
| 6,677,828 B1 | 1/2004 | Harnett et al. | |
| 7,251,121 B2 | 7/2007 | Bhutta | |
| 7,298,128 B2 | 11/2007 | Bhutta | |
| 7,489,145 B2* | 2/2009 | Matoba | H01J 37/321 324/601 |
| 8,134,816 B2* | 3/2012 | Kotani | H01J 37/32935 361/82 |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |
| 9,729,122 B2 | 8/2017 | Mavretic | |

(Continued)

FOREIGN PATENT DOCUMENTS

JP 2010-103123 A 5/2010
JP 2012-142285 A 7/2012

*Primary Examiner* — Dinh T Le
(74) *Attorney, Agent, or Firm* — Rudy J. Ng; Bret E. Field; Bozicevic, Field & Francis LLP

(57) ABSTRACT

An impedance matching device includes: a variable capacitor in which a plurality of first capacitance elements or a plurality of second capacitance elements are connected in parallel; a calculation unit that calculates an impedance or a reflection coefficient on the load side using information regarding the impedance acquired from the outside; and a control unit that determines an ON/OFF state to be taken by each of semiconductor switches included in the variable capacitor using the impedance or the reflection coefficient calculated by the calculation unit and turns on or off the semiconductor switches included in the first or second capacitance element based on the determined state. The control unit cyclically switches semiconductor switches to be turned on or off in a predetermined order.

15 Claims, 13 Drawing Sheets

(56) References Cited

U.S. PATENT DOCUMENTS

| | | |
|---|---|---|
| 9,745,660 B2 | 8/2017 | Bhutta |
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 2012/0168081 A1 | 7/2012 | Son |
| 2016/0065207 A1 | 3/2016 | Bhutta |
| 2016/0204757 A1* | 7/2016 | Kim ........................ H03H 7/40 333/32 |
| 2016/0380610 A1 | 12/2016 | Ulrich |
| 2017/0178865 A1 | 6/2017 | Ulrich |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |

\* cited by examiner

CAL: CALCULATION

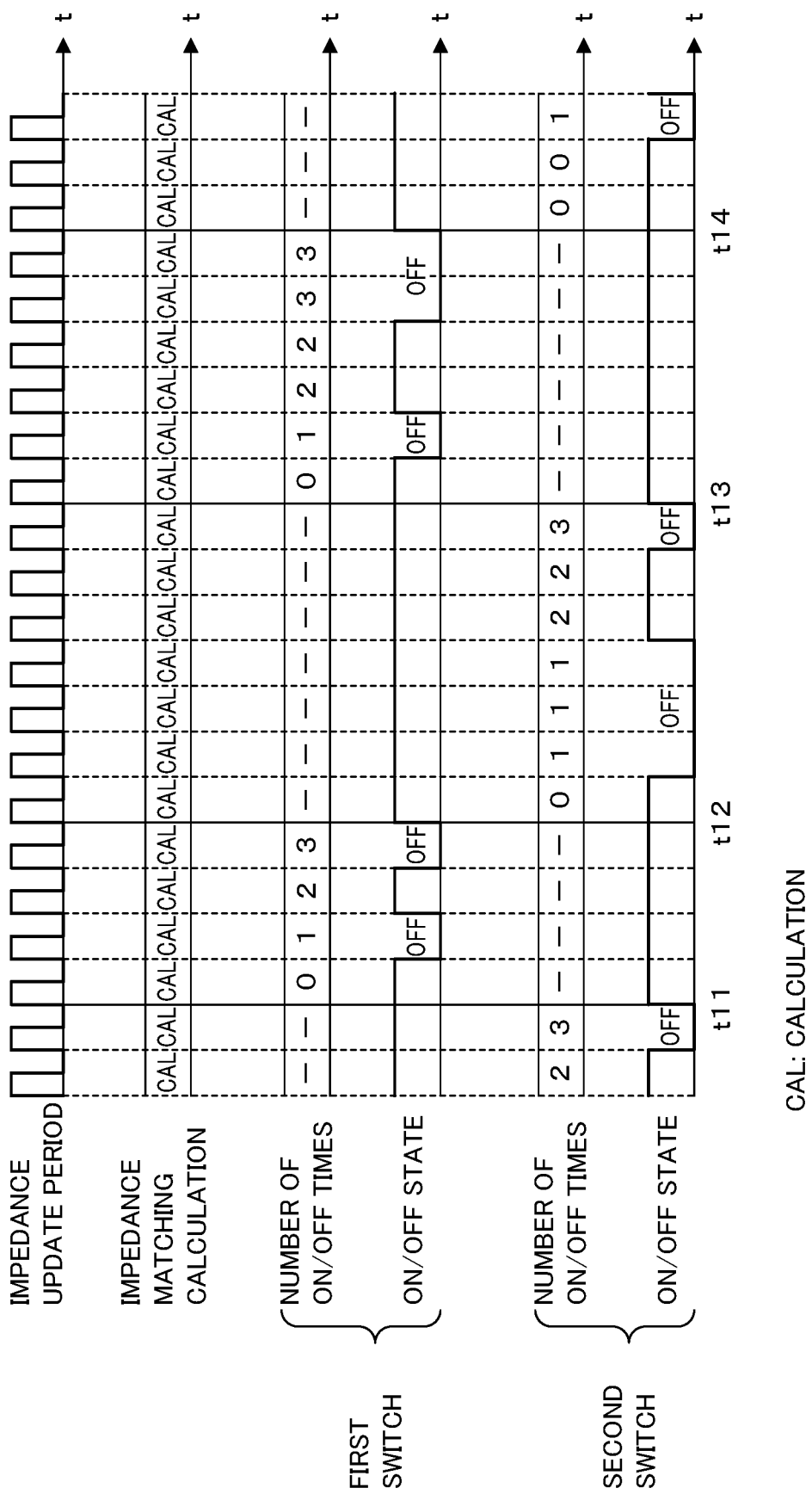

IMPEDANCE MATCHING DEVICE AND IMPEDANCE MATCHING METHOD

CROSS-REFERENCE TO RELATED APPLICATION

This non-provisional application claims priority under 35 U.S.C. § 119(a) on Patent Application No. 2018-245077 filed in Japan on Dec. 27, 2018, the entire contents of which are hereby incorporated by reference.

FIELD

The present disclosure relates to an impedance matching device and an impedance matching method for matching the impedance of a high frequency power supply and the impedance of a load with each other.

BACKGROUND

In the case of supplying power from a high frequency power supply to a load whose impedance changes, such as a plasma processing apparatus, an impedance matching device that matches the output impedance of the high frequency power supply with an impedance as the load side is viewed from the high frequency power supply is used in order to efficiently supply the power to the load (for example, refer to Japanese Patent Laid-Open Publication No. 2012-142285).

The impedance matching device described in Japanese Patent Laid-Open Publication No. 2012-142285 includes a variable capacitor in which a plurality of series circuits of capacitors and semiconductor switches are connected in parallel. The semiconductor switches are P-Intrinsic-N (PIN) diodes. The impedance matching device is provided between the high frequency power supply and the load.

The impedance matching device described in Japanese Patent Laid-Open Publication No. 2012-142285 is configured to perform impedance matching by adjusting the capacitance of the variable capacitor by switching (turning on and off) the semiconductor switches with a control signal of a controller.

However, in the case of supplying high frequency power to a load whose impedance frequently changes, such as a plasma processing apparatus, it is necessary to adjust the capacitance of the variable capacitor in a sequential manner following a change in the impedance on the load side. For this reason, the frequency of turning on and off the semiconductor switch is relatively high. In this case, there is a problem that a temperature rise due to switching loss of the semiconductor switch increases.

SUMMARY

It is an object of the disclosure to provide an impedance matching device and an impedance matching method capable of suppressing a temperature rise due to switching loss of a semiconductor switch.

An impedance matching device according to an aspect of the disclosure is an impedance matching device that is provided between a high frequency power supply and a load and acquires information regarding an impedance as the load side is viewed from an output end of the high frequency power supply or a portion equivalent to the output end and performs impedance matching between the high frequency power supply and the load, the device comprising: a variable capacitor in which a plurality of first capacitance elements or a plurality of second capacitance elements are connected in parallel, the first capacitance elements each including a plurality of series circuits each having a capacitor and a semiconductor switch, the second capacitance elements each including a capacitor and a plurality of combined semiconductor switches that are connected in series; a calculation unit that calculates an impedance or a reflection coefficient on the load side using the acquired information regarding the impedance; and a control unit that determines an ON/OFF state to be taken by the first capacitance element or the second capacitance element using the impedance or the reflection coefficient calculated by the calculation unit and turns on or off the semiconductor switches based on the determined state, wherein the control unit cyclically switches semiconductor switches to be turned on or off in a predetermined order for the first capacitance element or the second capacitance element.

An impedance matching method according to another aspect of the disclosure is an impedance matching method for performing impedance matching between a high frequency power supply and a load using a variable capacitor which is provided between the high frequency power supply and the load, wherein in the variable capacitor, a plurality of first capacitance elements or a plurality of second capacitance elements are connected in parallel, the first capacitance elements each including a plurality of series circuits each having a capacitor and a semiconductor switch, the second capacitance elements each including a capacitor and a plurality of combined semiconductor switches that are connected in series, the method comprising: acquiring information regarding an impedance as the load side is viewed from an output end of the high frequency power supply or a portion equivalent to the output end; calculating an impedance or a reflection coefficient on the load side using the acquired information regarding the impedance; determining an ON/OFF state to be taken by the first capacitance element or the second capacitance element using the calculated impedance or reflection coefficient; turning on or off the semiconductor switches based on the determined state; and cyclically switching semiconductor switches to be turned on or off in a predetermined order for the first capacitance element or the second capacitance element.

According to this aspect, a plurality of first capacitance elements, each of which includes a plurality of series circuits which are connected in parallel and each of which includes a capacitor and a semiconductor switch, or a plurality of second capacitance elements, each of which includes a capacitor and a circuit including a plurality of combined semiconductor switches that are connected in series, are connected in parallel, and are provided between the high frequency power supply and the load. Then, the information regarding the impedance as the load side is viewed from the output end of the high frequency power supply or the portion equivalent to the output end is acquired from the outside, and the current impedance or reflection coefficient on the load side is calculated using the acquired information. In addition, the portion equivalent to the output end of the high frequency power supply is, for example, an input end of the impedance matching device. In a case where the impedance on the load side is calculated, in order to adjust the capacitance of the variable capacitor so that the impedance on the load side after adjustment approaches the output impedance of the high frequency power supply, an ON/OFF state to be taken by each of the first capacitance elements or each of the second capacitance elements is determined. On the other hand, in a case where the reflection coefficient is calculated, in order to adjust the capacitance of the variable capacitor so that the actual reflection coefficient approaches 0, an ON/OFF state to be taken by each of the first capacitance elements or each of the second capacitance elements is determined. Then, in the case of newly adjusting the actual ON/OFF state of each semiconductor switch to ON or OFF so as to correspond to the determined ON/OFF state, semiconductor switches to be turned on or off, among the plurality of semiconductor switches included in each of the first capacitance elements or each of the second capacitance elements, are cyclically switched. As a result, since heat generated by the switching loss is distributed to the plurality of semiconductor switches, the temperature rise of each semiconductor switch can be suppressed.

In the impedance matching device according to the aspect of the disclosure, for the first capacitance element or the second capacitance element, the control unit cyclically switches semiconductor switches to be turned on or off each time one semiconductor switch is turned on or off N (N is an integer of 2 or more) times.

According to this aspect, in a case where one semiconductor switch of the plurality of semiconductor switches included in each of the first capacitance elements or each of the second capacitance elements is switched from ON to OFF or from OFF to ON N times in total, target semiconductor switches to be turned on or off are cyclically switched among the plurality of semiconductor switches included in the same first or second capacitance element. As a result, the frequency of ON/OFF of each of the plurality of semiconductor switches can be reduced according to the number of semiconductor switches included in each of the first capacitance elements or each of the second capacitance elements.

In the impedance matching device according to the aspect of the disclosure, for the first capacitance element or the second capacitance element, the control unit cyclically switches semiconductor switches to be turned on or off each time one semiconductor switch is turned on or off for a predetermined time.

According to this aspect, in a case where one semiconductor switch of the plurality of semiconductor switches included in each of the first capacitance elements or each of the second capacitance elements is switched from ON to OFF or from OFF to ON for a predetermined time, target semiconductor switches to be turned on or off are cyclically switched among the plurality of semiconductor switches included in the same first or second capacitance element. As a result, the frequency of ON/OFF of each semiconductor switch can be reduced according to the number of semiconductor switches included in each of the first capacitance elements or each of the second capacitance elements.

In the impedance matching device according to the aspect of the disclosure, in the first capacitance element, the plurality of capacitors have the same capacitance, and for the first capacitance element, the control unit controls one semiconductor switch from OFF to ON and then from ON to OFF in a state in which the plurality of semiconductor switches are controlled to be OFF so as to turn on only one of the plurality of semiconductor switches.

According to this aspect, the capacitances of the plurality of capacitors included in the first capacitance element in which a plurality of series circuits of capacitors and semiconductor switches are connected in parallel are the same, and one semiconductor switch is switched from OFF to ON and then switched from ON to OFF in a state in which all of the plurality of semiconductor switches are turned off. As a result, the capacitance of the first capacitance element viewed from the outside becomes 0 or the same as the capacitance of one capacitor.

In the impedance matching device according to the aspect of the disclosure, in the second capacitance element, all of the plurality of semiconductor switches are connected in parallel, and the control unit controls one semiconductor switch from OFF to ON and then from ON to OFF in a state in which the plurality of semiconductor switches are controlled to be OFF so as to turn on only one of the plurality of semiconductor switches.

In the impedance matching device according to the aspect of the disclosure, in the second capacitance element, all of the plurality of semiconductor switches are connected in series, and the control unit controls one semiconductor switch from ON to OFF and then from OFF to ON in a state in which the plurality of semiconductor switches are controlled to be ON so as to turn off only one of the plurality of semiconductor switches.

According to this aspect, for the second capacitance element in which a capacitor and a circuit including a plurality of combined semiconductor switches are connected in series, all of the plurality of semiconductor switches are connected in parallel or connected in series. In a case where all of the plurality of semiconductor switches are connected in parallel, one semiconductor switch is switched from OFF to ON and then switched from ON to OFF in a state in which all of these semiconductor switches are turned off. In addition, in a case where all of the plurality of semiconductor switches are connected in series, one semiconductor switch is switched from ON to OFF and then switched from OFF to ON in a state in which all of these semiconductor switches are turned on. As a result, the capacitance of the second capacitance element viewed from the outside becomes 0 or the same as the capacitance of one capacitor.

In the impedance matching device according to the aspect of the disclosure, some or all of the capacitors included in the variable capacitor have stepwise different capacitances.

According to this aspect, at least some of the capacitors included in the variable capacitor have stepwise different capacitances. Therefore, the adjustment range of the capacitance by the combination of capacitors connected in parallel can be made relatively large.

In the impedance matching device according to the aspect of the disclosure, some or all of the first capacitance elements or the second capacitance elements have a smaller number of semiconductor switches as a capacitance of a capacitor included in each of the capacitance elements is made larger.

According to this aspect, for some or all of the first capacitance elements or the second capacitance elements that include capacitors having large capacitances and are less frequently incorporated into the variable capacitor, the number of semiconductor switches is small. Therefore, the total number of semiconductor switches can be minimized.

According to the disclosure, it is possible to suppress the temperature rise due to switching loss of the semiconductor switch.

The above and further objects and features will more fully be apparent from the following detailed description with accompanying drawings.

BRIEF DESCRIPTION OF DRAWINGS

FIG. 13 is a timing chart showing the ON/OFF operation of semiconductor switches in the impedance matching device according to the third embodiment.

DETAILED DESCRIPTION

Hereinafter, the disclosure will be described in detail with reference to the diagrams illustrating embodiments thereof.

First Embodiment

Figure 1:
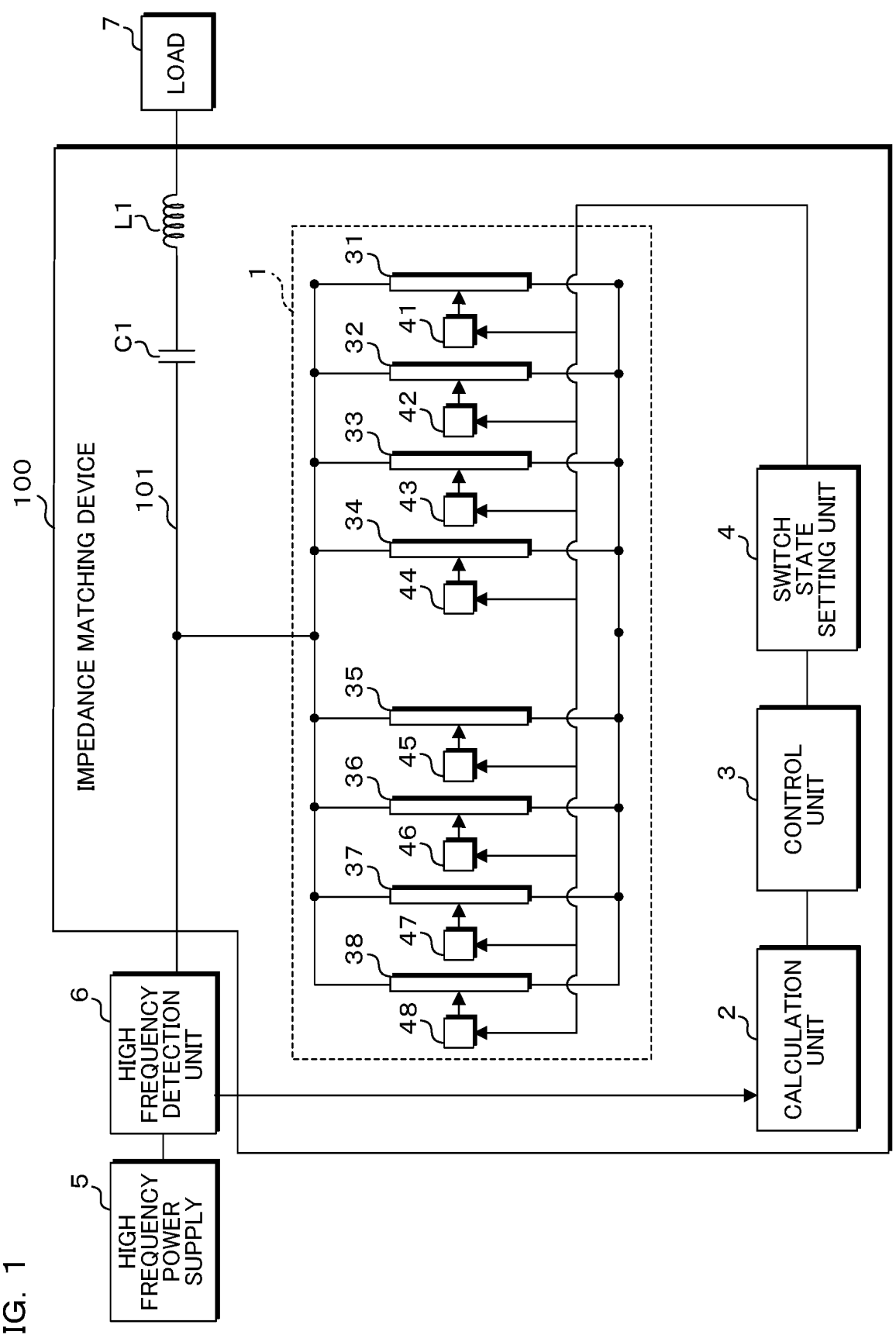
FIG. 1 is a block diagram illustrating an example of the configuration of an impedance matching device according to a first embodiment.

FIG. 1 is a block diagram illustrating an example of the configuration of an impedance matching device 100 according to a first embodiment. The impedance matching device 100 is provided between a high frequency power supply 5 that outputs high frequency power and a load 7 that consumes high frequency power. Between the high frequency power supply 5 and the impedance matching device 100, a high frequency detection unit 6 that allows high frequency power to pass therethrough and detects parameters, such as a high frequency voltage, is connected. That is, the high frequency detection unit 6 is interposed between the output end of the high frequency power supply 5 and the input end of the impedance matching device 100. The high frequency detection unit 6 may be included in the impedance matching device 100.

The high frequency power supply 5 is an AC power supply that outputs high frequency power in an industrial radio frequency (RF) band, such as 2 MHz, 13.56 MHz, 27 MHz, and 60 MHz, and the output impedance is set to a specified value, such as 50Ω. The high frequency power supply 5 includes an inverter circuit (not illustrated), and generates high frequency AC power by performing switching control of the inverter circuit.

The high frequency detection unit 6 detects parameters for calculating the impedance when the load 7 side is viewed from the output end of the high frequency power supply 5 or the input end of the impedance matching device 100 that is a portion equivalent to the output end (hereinafter, simply referred to as when the load 7 side is viewed or on the load 7 side) or parameters (corresponding to information regarding impedance) for calculating a reflection coefficient when the load 7 side is viewed. The impedance when the load 7 side is viewed is a combined impedance of the impedance of the load 7 and the impedance of the impedance matching device 100. Specifically, the high frequency detection unit 6 detects a high frequency voltage, a high frequency current, and a phase difference between the high frequency voltage and the high frequency current at its own position as parameters. Alternatively, the high frequency detection unit 6 detects high frequency traveling wave power (or traveling wave voltage) toward the load 7 and reflected wave power (or reflected wave voltage) reflected and returned from the load 7 as parameters. Using these detected parameters, a calculation unit 2 to be described later calculates an impedance or a reflection coefficient on the load 7 side based on a known method.

The load 7 performs various kinds of processing using the high frequency power supplied from the high frequency power supply 5, and examples thereof include a plasma processing apparatus and a non-contact power transmission apparatus. In the plasma processing apparatus, the state of plasma changes from moment to moment as the manufacturing process, such as plasma etching and plasma CVD, proceeds. As a result, the impedance of the load 7 changes.

The impedance matching device 100 includes a variable capacitor 1 having a variable capacitance, the calculation unit 2 that acquires the parameters from the high frequency detection unit 6 and calculates an impedance or a reflection coefficient on the load 7 side, and a control unit 3 that controls the capacitance of the variable capacitor 1 using the impedance or the reflection coefficient calculated by the calculation unit 2. The impedance matching device 100 further includes a switch state setting unit 4 that sets a semiconductor switch, which will be described later, provided in the variable capacitor 1 to ON/OFF, so that the control unit 3 controls the capacitance of the variable capacitor 1 through the switch state setting unit 4.

In the impedance matching device 100, a transmission line 101 extending to the high frequency detection unit 6 and a series circuit of a capacitor C1 and an inductor L1 whose one end on the inductor L1 side is connected to the load 7 are connected in cascade. The variable capacitor 1 is substantially a two-terminal circuit, one end of which is connected to the transmission line 101 and the other end is connected to the ground potential. That is, the variable capacitor 1 and the series circuit of the capacitor C1 and the inductor L1 form an L type matching circuit. The capacitor C1 may be replaced with another variable capacitor 1.

Here, a case in which the matching circuit is an L type has been described, but the matching circuit may be an inverted L type, T type, or π type. In addition, the series circuit of the capacitor C1 and the inductor L1 may be connected to the outside of the impedance matching device 100 (that is, between the impedance matching device 100 and the load 7). Hereinafter, a portion where high frequency power is input from the high frequency detection unit 6 to the transmission line 101 will be referred to as an input portion. In addition, a portion where high frequency power is output from the inductor L1 to the load 7 will be referred to as an output portion.

The variable capacitor 1 includes capacitance elements (corresponding to first capacitance elements) 31, 32, ..., 38 and driving circuits 41, 42, ..., 48 for driving semiconductor switches included in the capacitance elements 31, 32, ..., 38. One ends of the capacitance elements 31, 32, ..., 38 are connected to the transmission line 101. The other ends of the capacitance elements 31, 32, ..., 38 are connected to the ground potential. The number of capacitance elements 31, 32, ..., 38 and the number of driving circuits 41, 42, ..., 48 are not limited to eight.

Figure 2:
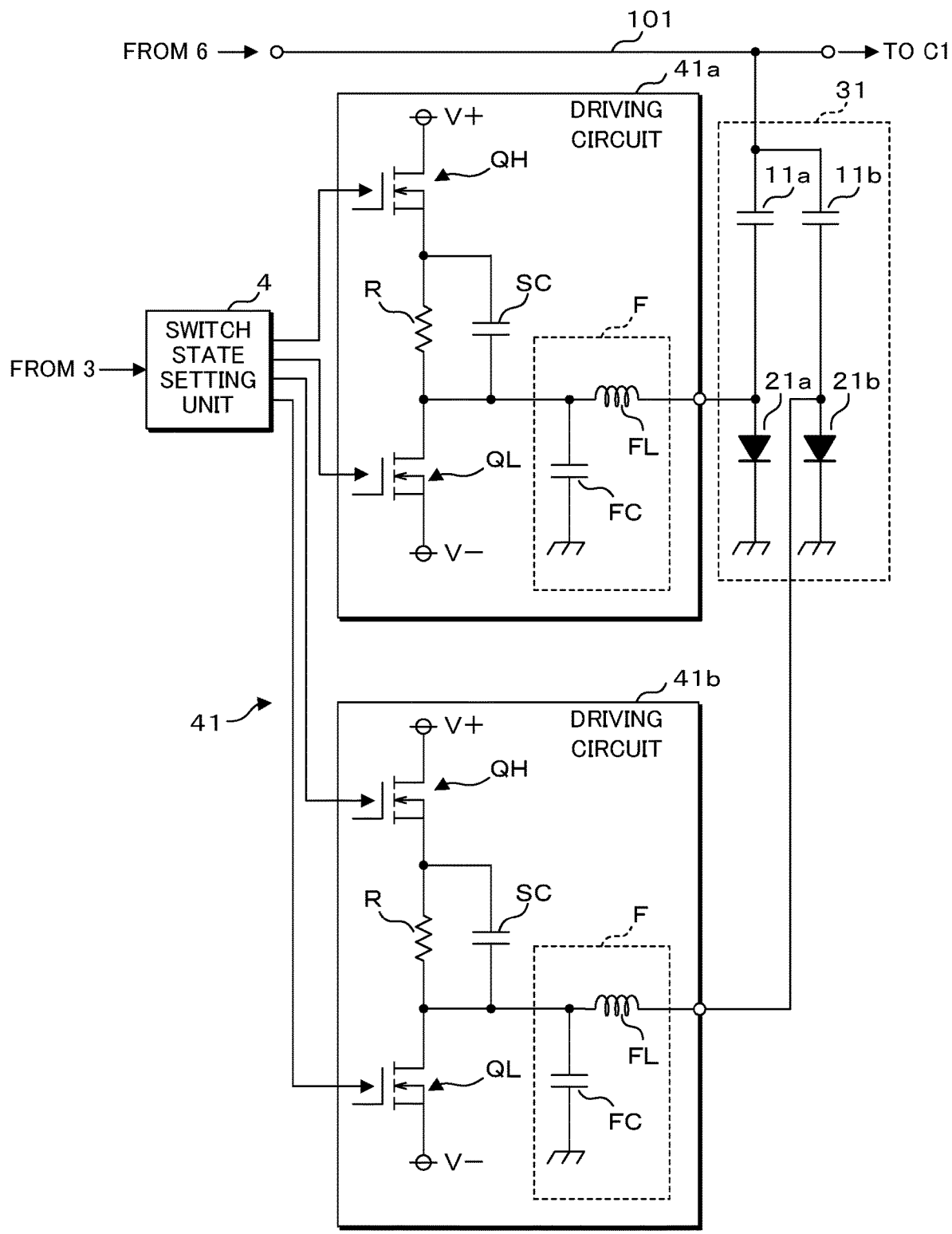
FIG. 2 is a circuit diagram illustrating an example of the configuration of a capacitance element and a driving circuit in the impedance matching device according to the first embodiment.

FIG. 2 is a circuit diagram illustrating an example of the configuration of a capacitance element 31 and a driving circuit 41 in the impedance matching device 100 according to the first embodiment. The capacitance element 31 includes a series circuit of a capacitor 11a and a semiconductor switch 21a, and a series circuit of a capacitor 11b and a semiconductor switch 21b. The series circuits are connected in parallel. The capacitor 11a has one end connected to the transmission line 101 and the semiconductor switch 21a has a cathode connected to the ground potential. The capacitor 11b has one end connected to the transmission line 101 and the semiconductor switch 21b has a cathode connected to the ground potential. The semiconductor switches 21a and 21b are, for example, PIN diodes. The capacitors 11a and 11b have the same capacitance. Here, "the same" means that the difference in capacitance is, for example, ±20% or less. This difference appears as a deviation in capacitance viewed from the outside of the capacitance element 31 in a case where any of the semiconductor switches 21a and 21b is ON. Therefore, the capacitances of the capacitors 11a and 11b may be different within a range in which this deviation is allowed.

The configurations of the other capacitance elements 32, 33, ..., 38 are the same as those described above except that capacitors 12a and 12b, 13a and 13b, ..., 18a and 18b are included and semiconductor switches 22a and 22b, 23a and 23b, ..., 28a and 28b are included inside the capacitance elements. The number of capacitors included in one capacitance element and the number of semiconductor switches included in one capacitance element are not limited to two, and may be three or more.

The driving circuit 41 includes driving circuits 41a and 41b having the same configuration. The same applies to the other driving circuits 42, 43, ..., 48. The driving circuit 41a includes an N channel type metal oxide semiconductor field effect transistor (MOSFET: hereinafter, referred to as a transistor) QH whose drain is connected to a positive power supply V+ and an N channel type transistor QL whose source is connected to a negative power supply V−. Between the source of the transistor QH and the drain of the transistor QH, a parallel circuit of a resistor R and a speed-up capacitor SC is connected. The transistors QH and QL may be other switching elements, such as an insulated gate bipolar transistor (IGBT).

The driving circuit 41a further includes an L type filter F including a capacitor FC, which is connected between the drain of the transistor QL and the ground potential, and an inductor FL, which is connected between the drain of the transistor QL and an output terminal Out. High level and low level complementary driving signals are applied from the switch state setting unit 4 to the gate of the transistor QH and the gate of the transistor QL. The voltage of the high level driving signal may be equal to the voltage of the positive power supply V+, for example. The voltage of the low level driving signal may be equal to the voltage of the negative power supply V−, for example.

In a case where a low level driving signal is applied to the gate of the transistor QL and a high level driving signal is applied to the gate of the transistor QH, the transistor QL is turned off and the transistor QH is turned on. Then, a forward current flows from the positive power supply V+ to the semiconductor switch 21a through the transistor QH, the resistor R, the speed-up capacitor SC, and the inductor FL included in the filter F, so that the semiconductor switch 21a is turned on. As a result, the capacitance of the capacitor 11a is included in the capacitance of the entire variable capacitor 1, and the capacitor 11a is incorporated into the variable capacitor 1.

On the other hand, in a case where a low level driving signal is applied to the gate of the transistor QH and a high level driving signal is applied to the gate of the transistor QL, the transistor QH is turned off and the transistor QL is turned on. Then, a backward current is applied from the negative power supply V− to the anode of the semiconductor switch 21a through the transistor QL and the inductor FL, so that the semiconductor switch 21a is turned off. As a result, the capacitance of the capacitor 11a is not included in the capacitance of the entire variable capacitor 1. As described above, the capacitance of the variable capacitor 1 is adjusted.

The application of voltage to the semiconductor switch 21b by the driving circuit 41b is the same as those described above. The semiconductor switches 21a and 21b are controlled so that both are not turned on at the same time. Specifically, both the semiconductor switches 21a and 21b are basically OFF, and either one of the semiconductor switches 21a and 21b is controlled from OFF to ON or from ON to OFF. In this manner, the incorporation of either one of the capacitors 11a and 11b into the variable capacitor 1 is controlled. Hereinafter, in the first embodiment, one of the semiconductor switches 21a and 21b that is turned on is referred to as a semiconductor switch 21 (the same applies to the other semiconductor switches 22, 23, ..., 28). In addition, one of the capacitors 11a and 11b, which is connected between the transmission line 101 and the ground potential by the semiconductor switch 21, is referred to as a capacitor 11 (the same applies to the other capacitors 12, 13, ..., 18).

In the first embodiment, the capacitance of some or all of the capacitors 11, 12, ..., 18 included in the variable capacitor 1 increases in a stepwise manner. More specifically, assuming that the capacitance of the capacitor 11 is Cmin, it is preferable that the capacitances of the capacitors 11, 12, ..., 18 are expressed by Cmin×$2^{i-1}$ (i=1, 2, ..., 8). In this manner, the capacitance of the variable capacitor 1 can be set to $2^8$ magnitudes in increments of Cmin.

In addition, the number of capacitors 11a and 11b, 12a and 12b, ..., 18a and 18b included in the capacitance elements 31, 32, ..., 38 and the number of semiconductor switches 21a and 21b, 22a and 22b, ..., 28a and 28b are not limited to a predetermined number (here, two). For example, for a capacitance element including a capacitor having a large capacitance, since the frequency of incorporation into the variable capacitor 1 is small, the number of capacitors and the number of semiconductor switches are set to two as illustrated in FIG. 2. For a capacitance element including a capacitor having a small capacitance, the number of capacitors and the number of semiconductor switches may be three. For some or all of the capacitance elements 31, 32, ..., 38, as described above, the number of capacitors and the number of semiconductor switches may be changed according to the magnitude of the capacitor or may not be changed.

Returning to FIG. 1, the calculation unit 2 includes, for example, a field programmable gate array (FPGA), and acquires parameters for calculating the impedance on the load 7 side or parameters for calculating the reflection coefficient on the load 7 side from the high frequency detection unit 6. The calculation unit 2 calculates and averages the impedance or the reflection coefficient on the load 7 side using the acquired parameters, and outputs the averaged impedance or reflection coefficient to the control unit 3.

The control unit 3 includes a central processing unit (CPU) (not illustrated), and controls the operation of each unit according to a control program stored in advance in a read only memory (ROM) and performs processing, such as input and output, calculation, and time measurement. A computer program that defines the procedure of each process by the CPU may be loaded in advance into a random access memory (RAM) using means (not illustrated), and the loaded computer program may be executed by the CPU. Alternatively, the control unit 3 may be configured by a microcomputer or a dedicated hardware circuit.

The control unit 3 acquires the impedance or the reflection coefficient on the load 7 side that has been calculated by the calculation unit 2. In a case where the impedance on the load 7 side is acquired, the control unit 3 determines the combination of the capacitors 11, 12, . . . , 18 of the variable capacitor 1 so that the impedance on the load 7 side matches the output impedance of the high frequency power supply 5. On the other hand, in a case where the reflection coefficient on the load 7 side is acquired, the control unit 3 determines the combination of the capacitors 11, 12, . . . , 18 of the variable capacitor 1 so that the reflection coefficient at the input portion approaches 0. If the magnitude of the reflection coefficient falls within the allowable range, it is considered that matching has been realized. By such control, power is efficiently supplied from the high frequency power supply 5 to the load 7. The following description will be given on the assumption that the calculation unit 2 calculates the impedance on the load 7 side and the control unit 3 determines the combination of the capacitors 11, 12, . . . , 18 by calculating the capacitance of the variable capacitor 1 using the calculated impedance. The determined combination of the capacitors 11, 12, . . . , 18 corresponds to ON/OFF states to be taken by the semiconductor switches 21, 22, . . . , 28 (hereinafter, also referred to as ON/OFF states to be taken by the capacitance elements 31, 32, . . . , 38).

The switch state setting unit 4 sets the ON/OFF states of the semiconductor switches 21, 22, . . . , 28 according to the combination of the capacitors 11, 12, . . . , 18 determined by the control unit 3, that is, ON/OFF states to be taken by the capacitance elements 31, 32, . . . , 38. In a case where the ON/OFF states of the semiconductor switches 21, 22, . . . , 28 are set by the switch state setting unit 4, the above-described complementary driving signals are applied to the corresponding driving circuits 41, 42, . . . , 48. As a result, the ON/OFF states of the semiconductor switches 21, 22, . . . , 28 of the variable capacitor 1 are newly controlled. Then, the capacitance of the variable capacitor 1 is adjusted to the capacitance calculated by the control unit 3.

Figure 3:
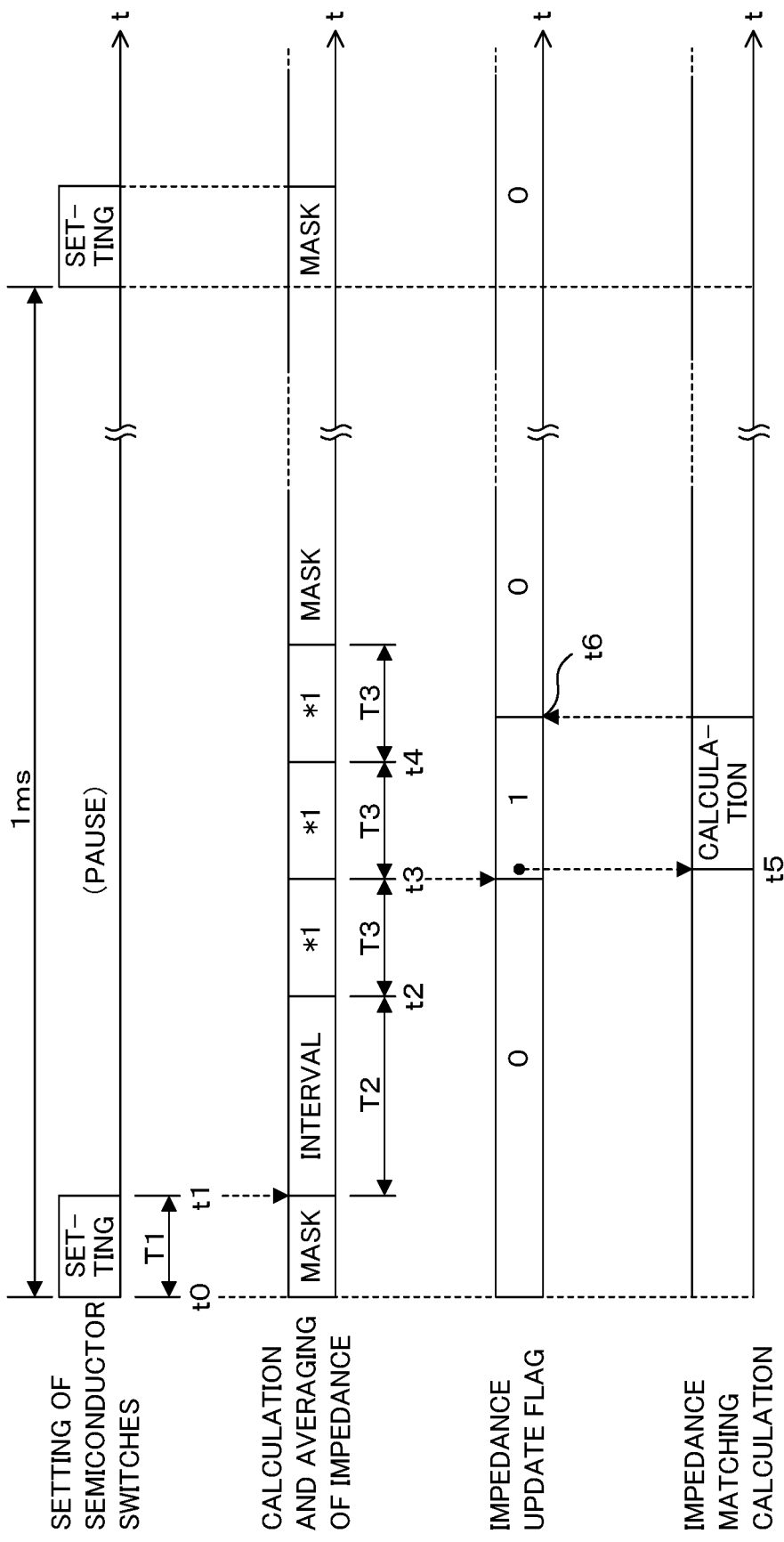
FIG. 3 is a timing chart illustrating the operation of the impedance matching device according to the first embodiment.

Next, the operation flow of the entire impedance matching device 100 will be described. FIG. 3 is a timing chart showing the operation of the impedance matching device 100 according to the first embodiment. The four timing charts shown in FIG. 3 all have the same time axis (t) as the horizontal axis. In order from the top, timings for performing setting of the semiconductor switches 21, 22, . . . , 28, calculation and averaging of the impedance on the load 7 side, setting and clearing of an impedance update flag, and impedance matching calculation are schematically shown. In the following description, it is assumed that B1, B2, . . . , B7 indicate the bit numbers of the semiconductor switches 21, 22, . . . , 28.

In the impedance matching device 100 according to the first embodiment, the sequence shown in FIG. 3 appears periodically, for example, once every 1 ms, but the period of the sequence is not limited to 1 ms. During this 1 ms, the capacitance of the variable capacitor 1 is calculated once, and the bits of the semiconductor switches 21, 22, . . . , 28 are set to ON or OFF based on the calculated capacitance. Among the operations corresponding to the timing charts shown in FIG. 3, the calculation and averaging of impedance and the setting and clearing of the impedance update flag are executed by the FPGA included in the calculation unit 2 (hereinafter, simply referred to as an FPGA), and operations corresponding to the other two timing charts are executed by the CPU provided in the control unit 3 (hereinafter, simply referred to as a CPU).

The settings of the semiconductor switches 21, 22, . . . , 28 performed from time t0 to time t1 are executed by the CPU during the time T1 according to the ON/OFF state determined in the immediately preceding period starting 1 ms before the time to.

Here, the semiconductor switches 21, 22, . . . , 28 are set in descending order of the bit numbers from the semiconductor switch 28 that is the most significant bit, but may be set in ascending order of the bit numbers from the semiconductor switch 21 that is the least significant bit. The CPU applies a mask signal to the FPGA, and turns off the mask signal when the setting of the semiconductor switch 21 (corresponding to B1) executed immediately before time t1 is completed.

One FPGA senses the mask signal applied from the CPU, and sets an interval of time T2 from when the mask signal is turned off to when the calculation and averaging of the impedance on the load 7 side are started. The length of the time T2 is, for example, 30 µs. This interval is a time to wait until the impedance on the load 7 side is stabilized by the setting of the semiconductor switch 21 executed immediately before time t1.

In a case where the above interval ends at time t2, the FPGA acquires a parameter for calculating the impedance on the load 7 side from the high frequency detection unit 6 multiple times during time T3, and calculates and averages the impedance on the load 7 side each time the parameter is acquired. The length of the time T3 is, for example, 15 µs. In a case where the first calculation and averaging end at time t3, the FPGA sets the impedance update flag cleared by the CPU before time t0 to 1. Thereafter, the FPGA repeats the calculation and averaging of the impedance on the load 7 side during time T3 starting from time t3 and time t4. The calculation and averaging are repeated until the mask signal is turned on by the CPU.

The CPU senses the impedance update flag set by the FPGA, and does not perform a matching calculation while the update flag is cleared to 0. In a case where the CPU senses that the impedance update flag is set to 1 at time t5, the CPU performs an impedance matching calculation, and clears the impedance update flag to 0 at time t6 at which the matching calculation ends. Then the CPU turns on the mask signal applied to the FPGA. The matching calculation herein is processing for acquiring the averaged impedance on the load 7 side from the FPGA, calculating the capacitance of the variable capacitor 1 so that the impedance on the load 7 side matches the output impedance of the high frequency power supply 5, and determining the ON/OFF states to be taken by the capacitance elements 31, 32, . . . , 38.

Figure 4:
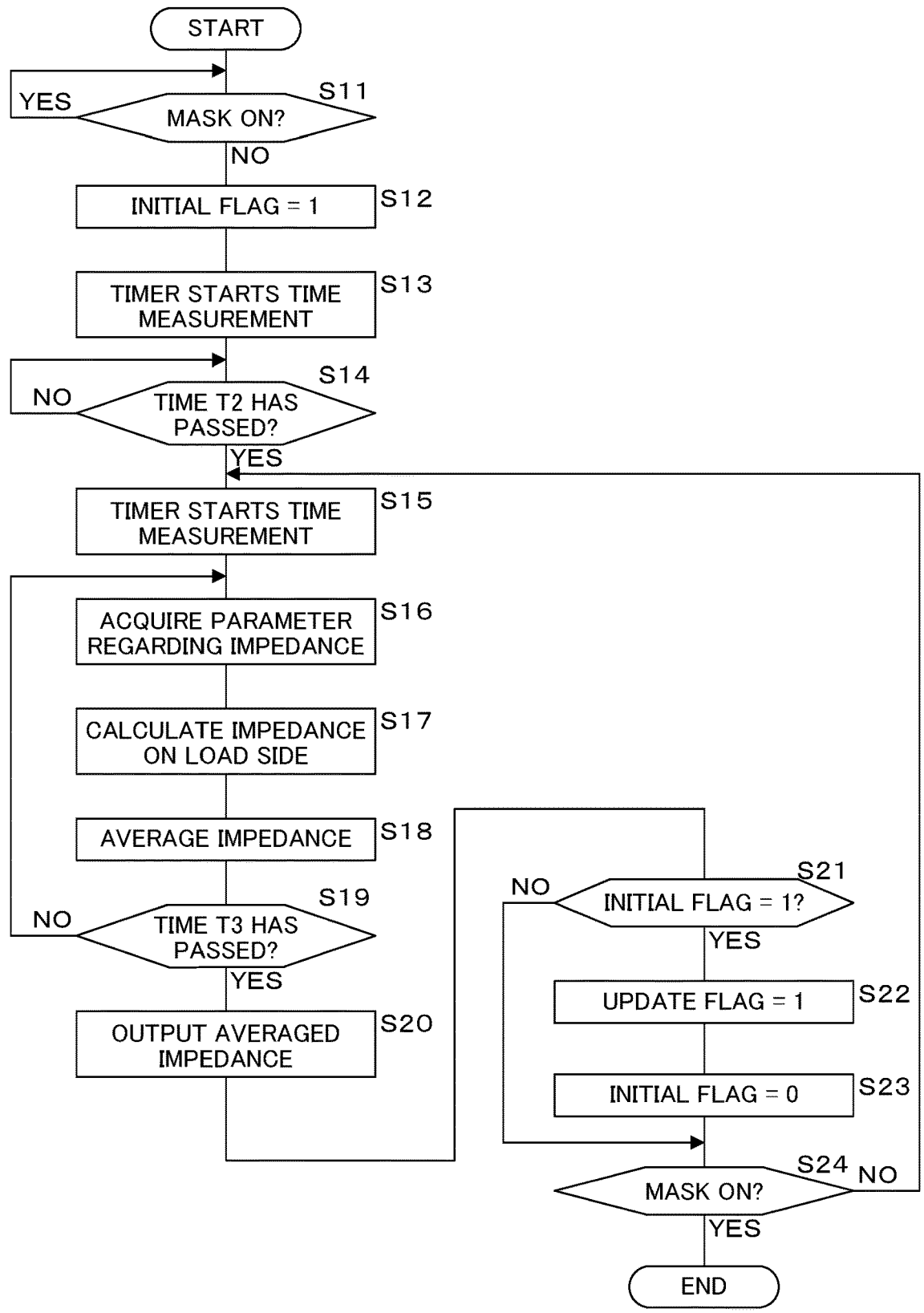
FIG. 4 is a flowchart illustrating the processing procedure of an FPGA that calculates and averages the impedance on the load side.
Figure 5:
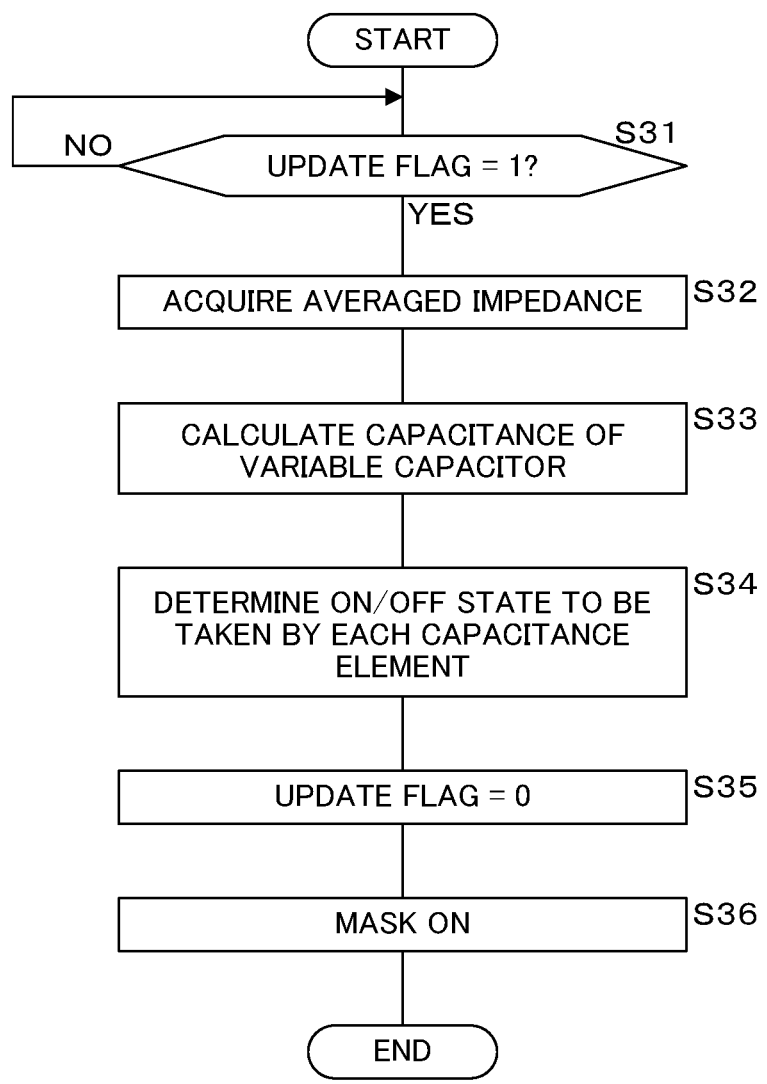
FIG. 5 is a flowchart illustrating the processing procedure of a CPU that performs an impedance matching calculation.
Figure 6:
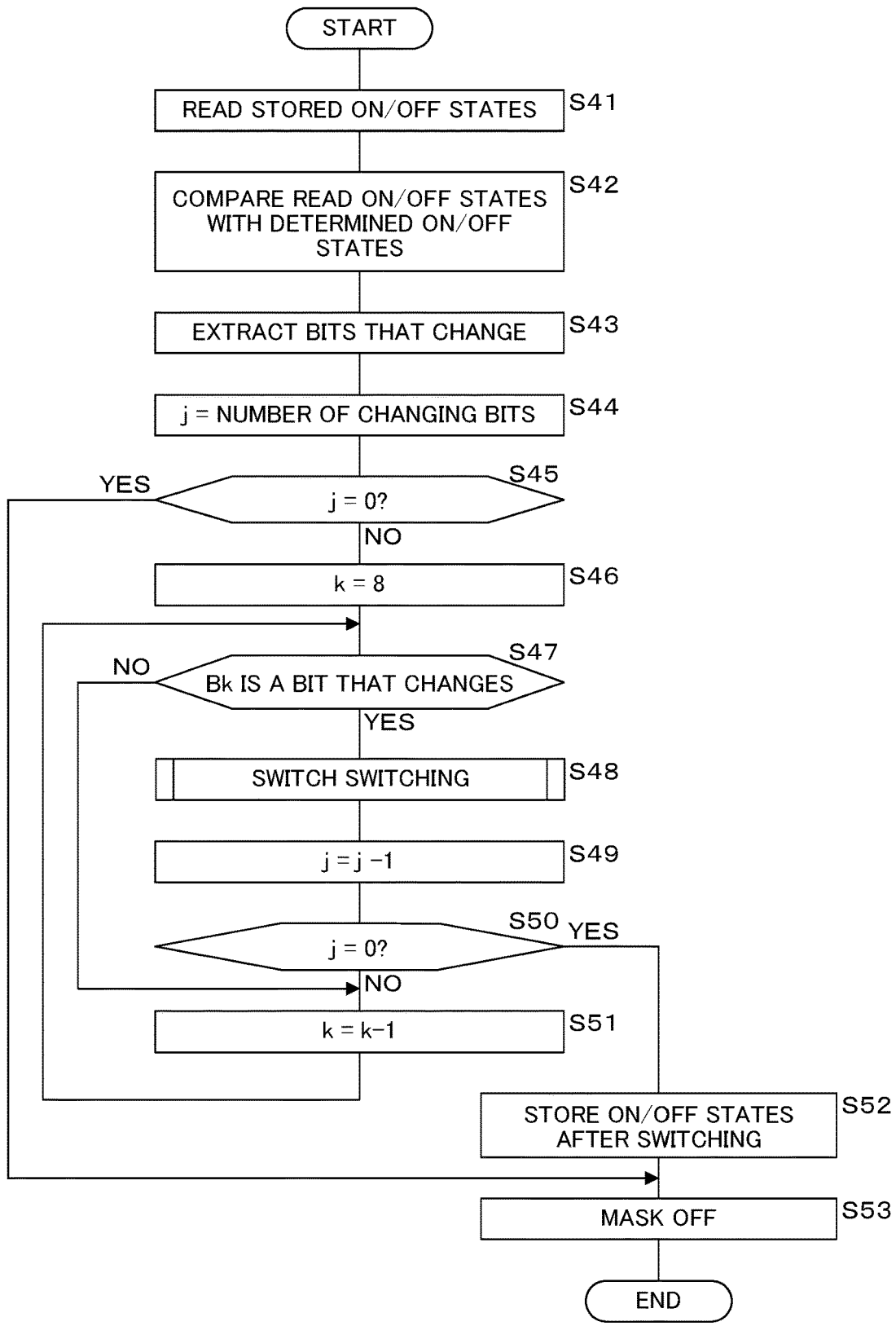
FIG. 6 is a flowchart illustrating the processing procedure of a CPU for switching ON/OFF of semiconductor switches in the impedance matching device according to the first embodiment.

Hereinafter, the operations of the calculation unit 2 and the control unit 3 described above will be described with reference to the flowcharts illustrating the operations. Details of switching of the semiconductor switches 21, 22, . . . , 28 will be described later. FIG. 4 is a flowchart illustrating the processing procedure of the FPGA that calculates and averages the impedance on the load 7 side. FIG. 5 is a flowchart illustrating the processing procedure of the CPU that performs an impedance matching calculation. FIG. 6 is a flowchart illustrating the processing procedure of the CPU for switching ON/OFF of the semiconductor switches 21, 22, . . . , 28 in the impedance matching device 100 according to the first embodiment. The process shown in FIG. 4 is started with an interval sufficiently shorter than 1 ms, for example, and is executed by the FPGA. The processes shown in FIGS. 5 and 6 are started simultaneously, for example, every 1 ms, and executed by the CPU according to a computer program stored in advance in a ROM (not illustrated).

In FIGS. 4 and 5, the impedance update flag is simply referred to as an update flag. The initial value of the update flag is 0. In FIGS. 4 and 6, the mask signal is simply referred to as a mask. The initial value of the mask signal is ON. The initial flag in FIG. 4 is a flag indicating that this is the first processing for calculating and averaging the impedance. In FIG. 6, j is for storing the number of changing bits among the semiconductor switches 21, 22, . . . , 28, and k is for storing the bit number under processing.

In a case where the process shown in FIG. 4 is started, the FPGA determines whether or not the mask signal is ON (S11). In a case where the mask signal is ON (S11: YES), the FPGA waits until the mask signal is turned off. In a case where the mask signal is turned off and the mask is removed (S11: NO), the FPGA sets the initial flag to 1 (S12), and starts time measurement using a timer (not illustrated) (S13). Then, the FPGA determines whether or not the time T2 has passed by the time measurement of the timer (S14). In a case where the time T2 has not passed (S14: NO), the FPGA waits until the time T2 passes. This time T2 is the above-described interval, and is, for example, 30 µs.

In a case where the interval of time T2 has passed (S14: YES), the FPGA starts time measurement using a timer (S15), and acquires information regarding the impedance, that is, parameters for calculating the impedance on the load 7 side, from the high frequency detection unit 6 (S16). Then, the FPGA calculates the impedance on the load 7 side using the acquired parameters (S17), and averages the calculated impedance in a sequential manner (S18). One calculation of the impedance ends within a time of 100 ns or less, for example. Then, the FPGA determines whether or not the time T3 has passed by the time measurement of the timer (S19). In a case where the time T3 has not passed (S19: NO), the process proceeds to step S16. This time T3 is, for example, 15 µs.

In a case where the time T3 has elapsed (S19: YES), the FPGA outputs the averaged impedance on the load 7 side (more specifically, data indicating the impedance) to the CPU (S20). Then, the FPGA determines whether or not the initial flag is set to 1 (S21). In a case where the initial flag is set to 1 (S21: YES), that is, in a case where the calculation and averaging of the impedance end first, the FPGA sets the impedance update flag to 1 (S22) and clears the initial flag to 0 (S23).

In a case where the processing of step S23 ends or in a case where the initial flag is not set to 1 in step S21 (S21: NO), the FPGA determines whether or not the mask signal is ON (S24). In a case where the mask signal is not still ON (S24: NO), the process proceeds to step S15 to repeat the calculation and averaging of the impedance on the load 7 side. On the other hand, in a case where the mask signal is turned on to perform masking again (S24: YES), the FPGA ends the process shown in FIG. 4.

In addition, parameters for calculating the reflection coefficient may be acquired in step S16, reflection coefficients when the load 7 side is viewed may be calculated in step S17, the reflection coefficients may be averaged in step S18, and the averaged reflection coefficient may be output in step S20.

In a case where the process shown in FIG. 5 is started, the CPU determines whether or not the impedance update flag is set to 1 (S31). In a case where the impedance update flag is not set to 1 (S31: NO), the CPU waits until the impedance update flag is set to 1. On the other hand, in a case where the impedance update flag is set to 1 (S31: YES), the CPU acquires the averaged impedance from the calculation unit 2 (S32), and calculates the capacitance of the variable capacitor 1 so that the impedance on the load 7 side matches the output impedance of the high frequency power supply 5 (S33). Then, the CPU determines ON/OFF states to be taken by the capacitance elements 31, 32, . . . , 38, that is, ON/OFF states to be taken by the semiconductor switches 21, 22, . . . , 28, so that the capacitance of the variable capacitor 1 becomes the calculated capacitance (S34). Then, the CPU clears the update flag to 0 (S35), turns on the mask signal (S36), and ends the process shown in FIG. 5.

In addition, in a case where the reflection coefficient is output by the process illustrated in FIG. 4, the averaged reflection coefficient may be acquired in step S32 of FIG. 5, and the capacitance of the variable capacitor 1 may be calculated so that the reflection coefficient when the load 7 side is viewed approaches 0 in step S33.

In a case where the process shown in FIG. 6 is started, the CPU reads the ON/OFF states of the semiconductor switches 21, 22, . . . , 28 stored in a RAM (not illustrated) in the processing one period before (S41), and compares the read ON/OFF states with the ON/OFF states determined in step S34 of FIG. 5 (S42). Then, the CPU extracts bits that change from ON to OFF or from OFF to ON based on the comparison result (S43), and substitutes the number of changing bits for j (S44). Then, the CPU determines whether or not j is 0, that is, whether or not there is a changing bit (S45). In a case where j is 0 (S45: YES), the process proceeds to step S53, which will be described later, to turn off the mask signal. On the other hand, in a case where j is not 0 (S45: NO), the CPU initializes k to 8 (S46).

Then, the CPU determines whether or not Bk, which is the k-th bit among the semiconductor switches 21, 22, . . . , 28, is a bit that changes from ON to OFF or from OFF to ON (S47). In a case where Bk is not a changing bit (S47: NO), the CPU moves the processing to step S51, which will be described later, to search for a changing bit. On the other hand, in a case where Bk is a changing bit (S47: YES), the CPU calls and executes a subroutine relevant to switch switching, which will be described later, to actually switch ON/OFF of the k-th semiconductor switch corresponding to Bk (S48).

When returning from the subroutine relevant to switch switching, the CPU decrements j by 1 (S49), and determines whether or not j is 0, that is, whether or not the number of remaining bits that change is 0 (S50). In a case where j is not 0 (S50: NO), the CPU decrements k by 1 (S51), and then moves the processing to step S47 to further search for a changing bit.

In a case where j is 0 in step S50 (S50: YES), that is, in a case where the number of remaining bits that change is 0, the CPU stores the ON/OFF states of the semiconductor switches 21, 22, . . . , 28 after switching (S52), and further turns off the mask signal (S53) to end the process shown in FIG. 6. The ON/OFF states stored herein are read in step S41 in the next one period. In addition, the ON/OFF states after switching stored in step S52 match the ON/OFF states determined in step S34 of FIG. 5.

In the flowchart illustrated in FIG. 6 described above, bits that change from ON to OFF or from OFF to ON among the semiconductor switches 21, 22, . . . , 28 are extracted, and ON/OFF of the semiconductor switches 21, 22, . . . , 28 is switched only for the extracted bits. However, the invention is not limited to this. For example, regardless of whether or not each bit of the semiconductor switches 21, 22, . . . , 28 changes, ON/OFF of the semiconductor switches 21, 22, . . . , 28 may be newly set for all the bits.

Specifically, among the steps illustrated in FIG. 6, steps S41 to 43, S45, and S47 may be deleted (the process may proceed to the next numbered step), and 8 (the total number of bits) may be substituted for j in step S44, and ON/OFF may be newly set for the k-th semiconductor switch corresponding to Bk in the subroutine relevant to the switch switching in step S48.

Figure 7:
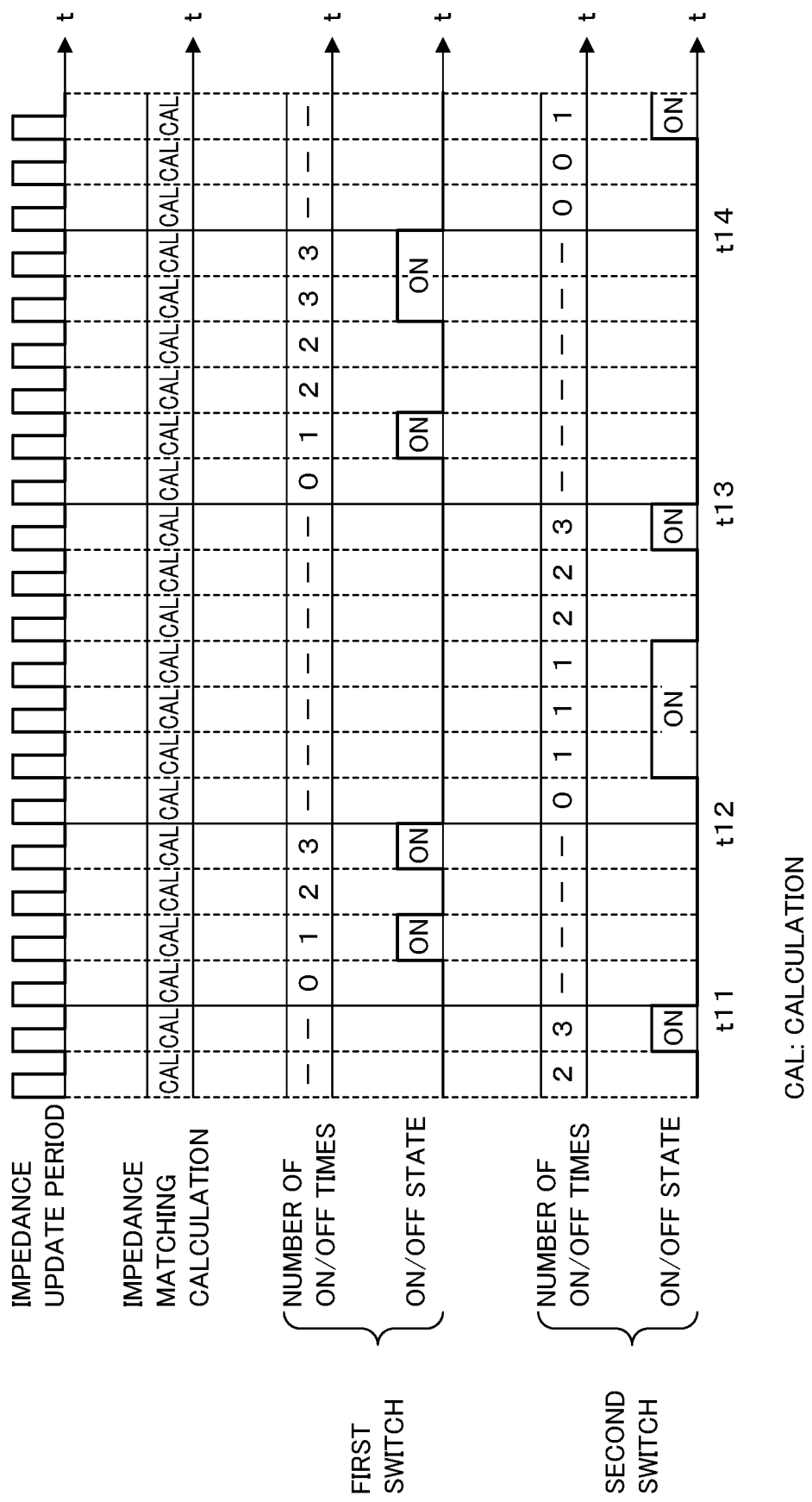
FIG. 7 is a timing chart showing the ON/OFF operation of semiconductor switches in the impedance matching device according to the first embodiment.

Next, a method of turning on and off the semiconductor switch 21, that is, a method of turning on and off one of the semiconductor switches 21a and 21b will be described. FIG. 7 is a timing chart showing ON/OFF operations of the semiconductor switches 21a and 21b in the impedance matching device 100 according to the first embodiment. The six timing charts shown in FIG. 7 all have the same time axis (t) as the horizontal axis. In order from the top, an impedance update period, an impedance matching calculation, the number of ON/OFF times and the ON/OFF state of a first switch, and the number of ON/OFF times and the ON/OFF state of a second switch are schematically shown.

Here, the first switch and the second switch indicate the semiconductor switches 21a and 21b, respectively (the same applies to cases where the first switch and the second switch indicate the semiconductor switches 22a and 22b, . . . , the semiconductor switches 28a and 28b).

The impedance update period corresponds to a period which is, for example, 1 ms for one cycle and in which the sequence shown in FIG. 3 appears. The impedance matching calculation corresponds to the matching calculation shown at the bottom of FIG. 3, and a plurality of calculations performed within a time corresponding to the impedance update period are representatively expressed as "CAL" in FIG. 7. The number of ON/OFF times of the first switch or the second switch indicates the cumulative number of times by which the first switch or the second switch is controlled from ON to OFF or from OFF to ON according to the impedance update. Then, as the cumulative number of times is counted up, the ON/OFF state of the first switch or the second switch changes as shown in FIG. 7.

In the example shown in FIG. 7, when the number of ON/OFF times of the first switch or the second switch becomes 4 (4 is not shown), target switches to be turned on or off are cyclically switched. Specifically, when the second switch is controlled from ON to OFF at time t11 and accordingly the number of ON/OFF times is changed from 3 to 4, target switches to be turned on or off are cyclically switched from the second switch to the first switch. At this point in time, there is no change in the state of the first switch. The second switch that is not a target switch to be turned on or off maintains the OFF state. Then, whenever the impedance is updated and ON/OFF of the semiconductor switch 21 needs to be switched, the first switch is controlled from OFF to ON or from ON to OFF, and each time the number of ON/OFF times of the first switch is counted up.

When the first switch is controlled from ON to OFF at time t12 and accordingly the number of ON/OFF times is changed from 3 to 4, target switches to be turned on or off are cyclically switched from the first switch to the second switch. At this point in time, there is no change in the state of the second switch. The first switch that is not a target switch to be turned on or off maintains the OFF state. Then, whenever the impedance is updated and ON/OFF of the semiconductor switch 21 needs to be switched, the second switch is controlled from OFF to ON or from ON to OFF, and each time the number of ON/OFF times of the second switch is counted up. Similarly hereinafter, target switches to be turned on or off are cyclically switched to the first switch at time t13 and cyclically switched from the first switch to the second switch at time t14.

In the example shown in FIG. 7, target switches to be turned on or off are switched when the number of ON/OFF times of the first switch or the second switch becomes 4. However, in a case where the number of ON/OFF times is an even number, such as 2, 6, and 8, the number of ON/OFF times is simply reduced or increased, and therefore, timing charts similar to those shown in FIG. 7 are applied. On the other hand, in a case where the number of ON/OFF times is an odd number, such as 3 and 5, timing charts different from those shown in FIG. 7 are applied.

Figure 8:
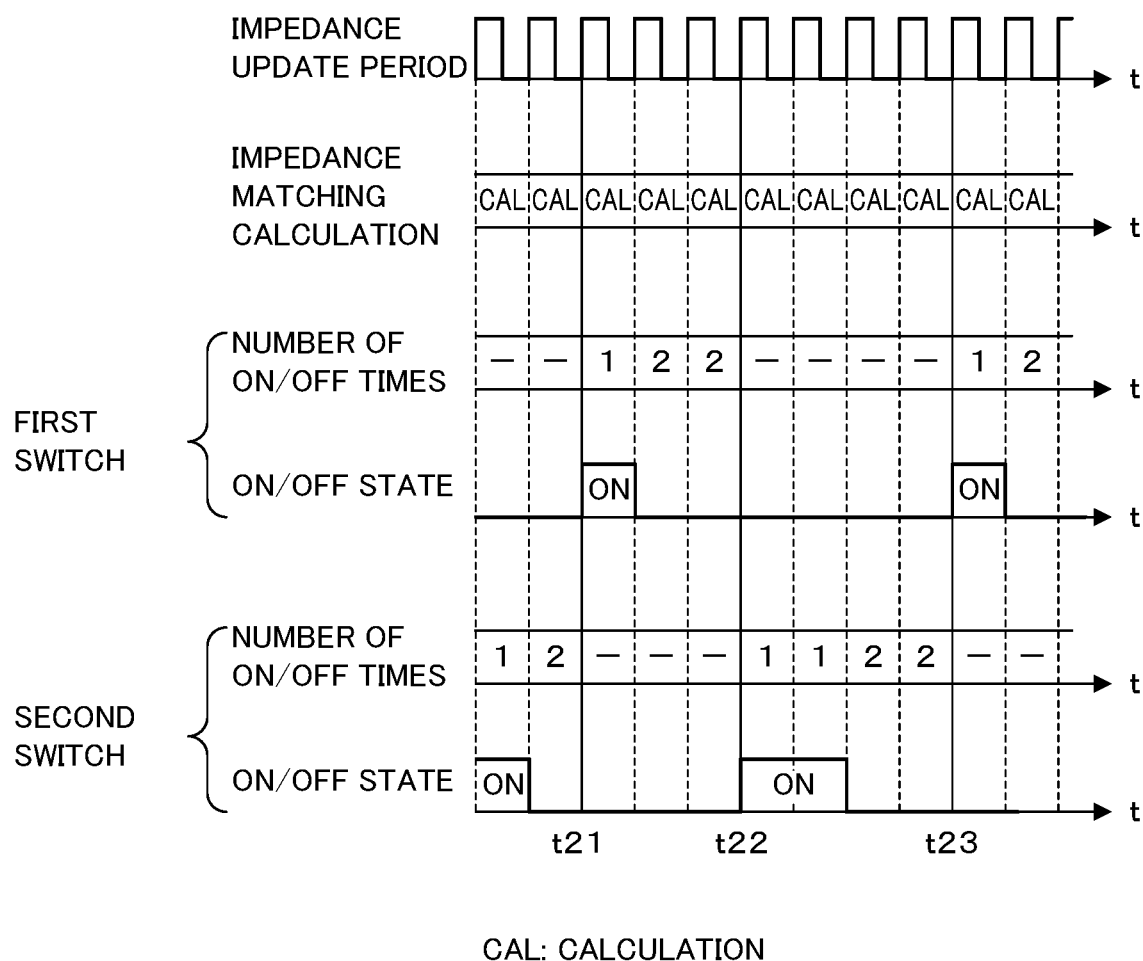
FIG. 8 is another timing chart showing the ON/OFF operation of semiconductor switches in the impedance matching device according to the first embodiment.

FIG. 8 is another timing chart showing ON/OFF operations of the semiconductor switches 21a and 21b in the impedance matching device 100 according to the first embodiment. The timing chart shown in FIG. 8 is different from the case shown in FIG. 7 in that target switches to be turned on or off are switched when the number of ON/OFF times of the first switch or the second switch becomes 3. Since the impedance update period and the impedance matching calculation are the same as those shown in FIG. 7, other detailed description regarding the diagrams will be omitted.

As an example, when the number of ON/OFF times is changed from 2 to 3 (3 is not shown) in order to control the second switch from OFF to ON at time t21, target switches to be turned on or off are cyclically switched from the second switch to the first switch. In a case where the second switch is turned on at this point in time, ON/OFF of the first switch becomes invalid thereafter. For this reason, at time t21, the first switch is turned on without turning on the second switch. Therefore, the number of ON/OFF times of the first switch is 1 instead of 0. Then, whenever the impedance is updated and ON/OFF of the semiconductor switch 21 needs to be switched, the first switch is controlled from ON to OFF or from OFF to ON, and each time the number of ON/OFF times of the first switch is counted up. However, in the example shown in FIG. 8, the first switch is not controlled from OFF to ON until the target switch to be turned on or off is switched to the second switch.

When the number of ON/OFF times is changed from 2 to 3 in order to control the first switch from OFF to ON at time t22, target switches to be turned on or off are cyclically switched from the first switch to the second switch. In a case where the first switch is turned on at this point in time, ON/OFF of the second switch becomes invalid thereafter. For this reason, at time t22, the second switch is turned on without turning on the first switch. Therefore, the number of ON/OFF times of the second switch is 1 instead of 0. Then, whenever the impedance is updated and ON/OFF of the semiconductor switch 21 needs to be switched, the second switch is controlled from ON to OFF or from OFF to ON, and each time the number of ON/OFF times of the second switch is counted up. Similarly hereinafter, target switches to be turned on or off are cyclically switched from the second switch to the first switch at time t23.

Figure 9:
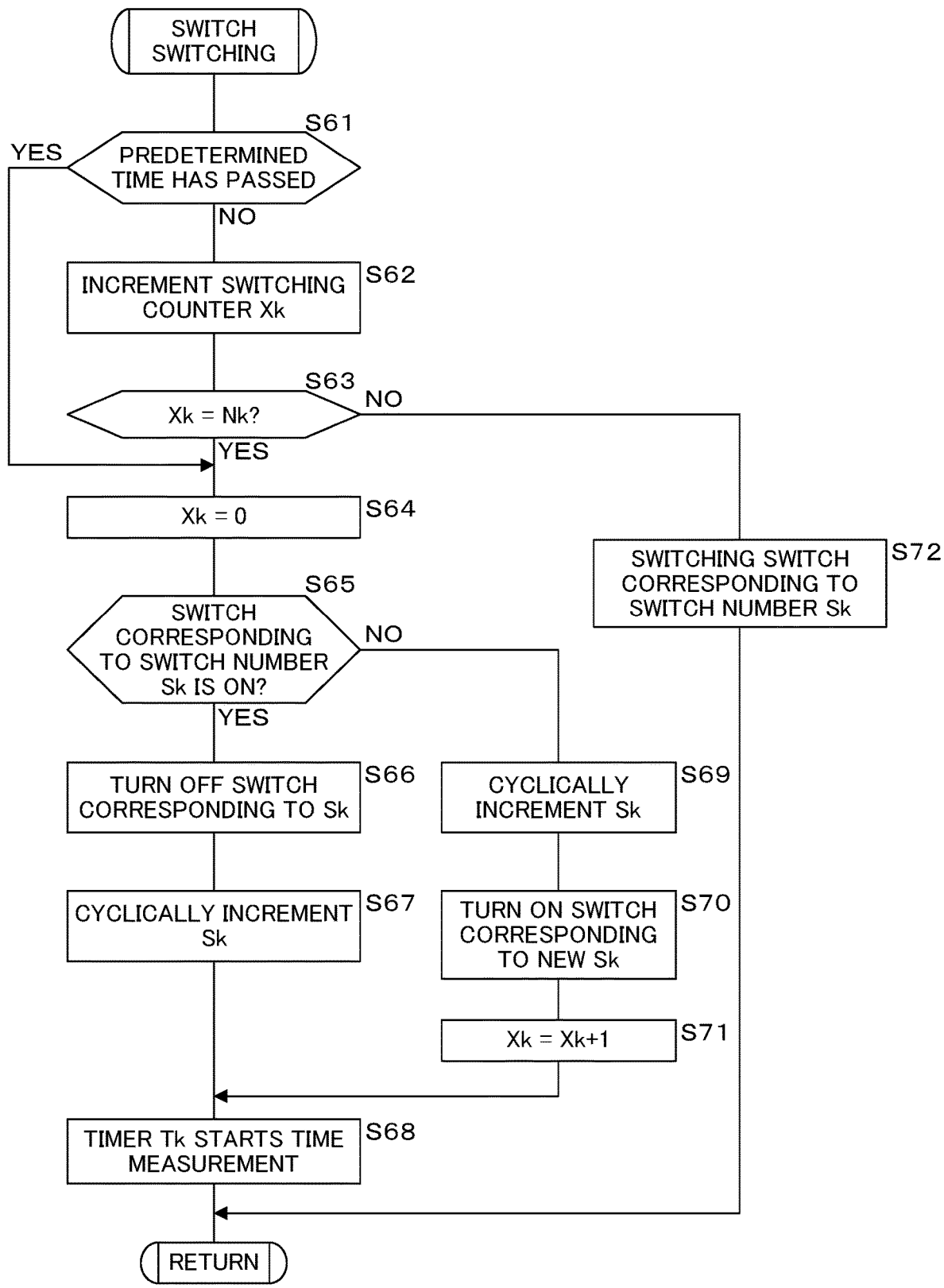
FIG. 9 is a flowchart illustrating the processing procedure of a CPU relevant to the subroutine of switch switching.

Hereinafter, the operation of the control unit 3 shown in FIGS. 7 and 8 will be described with reference to the flowchart illustrating the operation. FIG. 9 is a flowchart illustrating the processing procedure of the CPU relevant to the subroutine of switch switching. The subroutine illustrated in FIG. 9 is called up to a total of eight times for each bit in step S48 in the main routine illustrated in FIG. 6 during one cycle of the impedance update period. k (k=1, 2, . . . , 8) in Tk, Xk, Nk, and Sk in the diagram corresponds to the bit number under processing that has been introduced in FIG. 6.

Tk is a timer corresponding to each bit number. This timer counts the upper limit time (predetermined time in FIG. 9) during which ON/OFF control is continued for one semiconductor switch. The upper limit time may be changed after a bit. Xk is a switching counter corresponding to each bit number, that is, a counter that counts the number of ON/OFF times. Nk is an upper limit value of the number of ON/OFF times corresponding to each bit number. In the examples shown in FIGS. 7 and 8, Nk is 4 and 3. This upper limit is an integer of 2 or more, and may be changed for each bit. Sk is obtained by cyclically counting the serial number of semiconductor switches, of which ON/OFF control is performed, for each bit number. In the first embodiment, since two semiconductor switches are used for each bit, the count value of Sk changes cyclically as 0, 1, 0, 1, . . . . For example, in a case where three semiconductor switches are used for each bit, the count value of Sk changes cyclically as 0, 1, 2, 0, 1, 2, . . . , but may be changed as 2, 1, 0, 2, 1, 0, . . . . In FIG. 9, the semiconductor switch is simply referred to as a switch.

In a case where the subroutine illustrated in FIG. 9 is called, the CPU determines whether or not a predetermined time has passed by time measurement of a timer Tk (S61). In a case where the predetermined time has not passed (S61: NO), the CPU increments a switching counter Xk (S62). Thereafter, the CPU determines whether or not Xk has become Nk (S63). In a case where Xk has become Nk (S63: YES), the CPU initializes Xk to 0 (S64), and further determines whether or not the semiconductor switch corresponding to the switch number Sk is ON (S65). This determination is for determining to which case of FIG. 7 and FIG. 8 the timing relevant to the target semiconductor switch corresponds. For example, in the case of k=1, in a case where the subroutine is called between times t11 and t12 in FIG. 7, Sk=0 and it is determined whether or not the semiconductor switch 21a as the first switch is ON.

In a case where the semiconductor switch corresponding to Sk is ON (S65: YES), that is, in a case corresponding to the timing shown in FIG. 7, the CPU turns off the semiconductor switch corresponding to Sk (S66) and cyclically increments Sk (S67). As a result, target semiconductor switches to be turned on or off are cyclically switched. Then, the CPU starts time measurement using the timer Tk (S68), and then returns to the called main routine.

In a case where the semiconductor switch corresponding to Sk is not ON in step S65 (S65: NO), that is, in a case corresponding to the timing shown in FIG. 8, the CPU cyclically increments Sk without turning on the semiconductor switch corresponding to Sk (S69). As a result, target semiconductor switches to be turned on or off are cyclically switched. Then, the CPU turns on the semiconductor switch corresponding to the new Sk (S70) and increments the switching counter Xk that counts the number of ON/OFF times (S71). Then, the CPU moves the processing to step S68 to start time measurement using the timer Tk.

On the other hand, in a case where Xk is not Nk in step S63, that is, in a case where target semiconductor switches to be turned on or off are not switched, the CPU switches the semiconductor switch corresponding to the switch number Sk from ON to OFF or from OFF to ON (S72), and then returns to the called main routine.

In the subroutine illustrated in FIG. 9 described above, determining whether or not a predetermined time has passed by the time measurement of the timer Tk is limited to the case of being called from the main routine illustrated in FIG. 6. That is, in a case where a state in which Bk is not a changing bit continues, a state in which there is no chance of determining whether or not a predetermined time has passed by the time measurement of the timer Tk may continue for a long time. Even in such a case, in interrupt processing by the timer Tk or processing starting from the interrupt processing, it is possible to determine whether or not a predetermined time has passed by the time measurement of the timer Tk. The processing procedure in this case will be described below.

Figure 10:
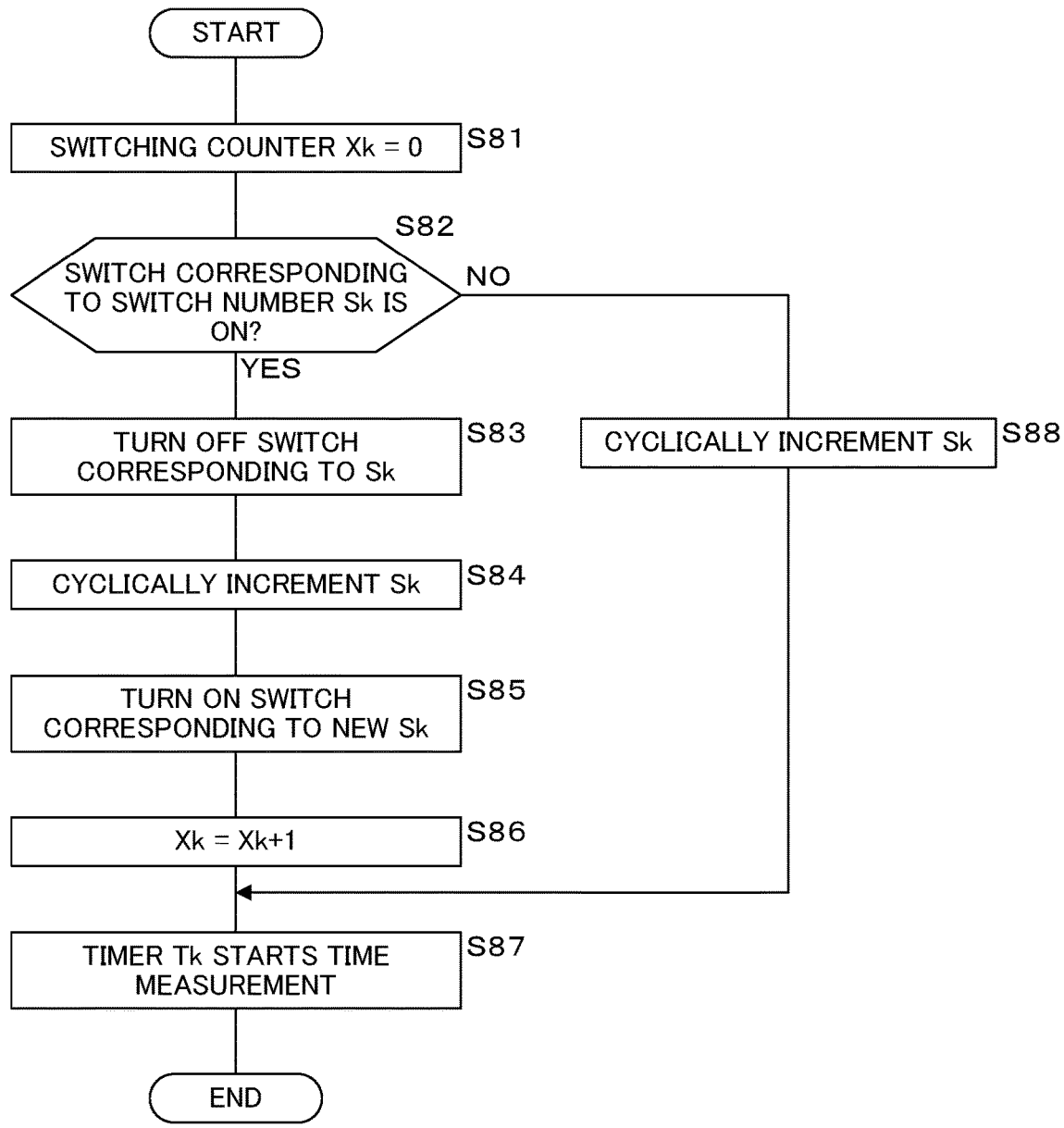
FIG. 10 is a flowchart illustrating the processing procedure of a CPU that switches target semiconductor switches to be turned on or off.

FIG. 10 is a flowchart illustrating the processing procedure of the CPU that switches target semiconductor switches to be turned on or off. In a case where the process illustrated in FIG. 10 is started, the CPU initializes the switching counter Xk that counts the number of ON/OFF times to 0 (S81), and determines whether or not the semiconductor switch corresponding to the switch number Sk is ON (S82). This determination is for determining to which case of FIG. 7 and FIG. 8 the timing relevant to the target semiconductor switch corresponds (refer to step S65 in FIG. 9).

In a case where the semiconductor switch corresponding to Sk is ON (S82: YES), that is, in a case corresponding to the timing shown in FIG. 7, the CPU forcibly turns off the semiconductor switch corresponding to Sk (S83) and cyclically increments Sk (S84). As a result, target semiconductor switches to be turned on or off are cyclically switched. Then, the CPU turns on the semiconductor switch corresponding to the new Sk (S85) and increments the switching counter Xk that counts the number of ON/OFF times (S86). Then, the CPU starts time measurement using the timer Tk (S87), and ends the process illustrated in FIG. 10.

On the other hand, in a case where the semiconductor switch corresponding to Sk is not ON in step S82 (S82: NO), that is, in a case corresponding to the timing shown in FIG. 8, the CPU cyclically increments Sk without turning on the semiconductor switch corresponding to Sk (S88). As a result, target semiconductor switches to be turned on or off are cyclically switched. That is, in this case, target semiconductor switches to be turned on or off are simply switched. Then, the CPU moves the processing to step S87 to start time measurement using the timer Tk.

As described above, according to the first embodiment, eight capacitance elements of the capacitance element 31 in which two series circuits of a series circuit of the capacitor 11a and the semiconductor switch 21a and a series circuit of the capacitor 11b and the semiconductor switch 21b are connected in parallel, the capacitance element 32 including the capacitors 12a and 12b and the semiconductor switches 22a and 22b configured similarly to those described above, . . . , and the capacitance element 38 are connected in parallel, and these are provided between the high frequency power supply 5 and the load 7. Then, parameters regarding the impedance when the load 7 side is viewed from the output end of the high frequency power supply 5 or the input end of the impedance matching device are acquired from the high frequency detection unit 6 (step S16), and the current impedance or reflection coefficient on the load 7 side is calculated using the acquired parameters (step S17). In a case where the impedance on the load 7 side is calculated, in order to adjust the capacitance of the variable capacitor 1 so that the impedance on the load 7 side after adjustment approaches the output impedance of the high frequency power supply 5, ON/OFF states to be taken by the capacitance elements 31, 32, . . . , 38 are determined (step S34). On the other hand, in a case where the reflection coefficient is calculated, in order to adjust the capacitance of the variable capacitor 1 so that the actual reflection coefficient approaches 0, ON/OFF states to be taken by the capacitance elements 31, 32, . . . , 38 are determined. Then, in the case of newly adjusting the actual ON/OFF state to ON or OFF for each of the semiconductor switches 21a or 21b, 22a or 22b, . . . , 28a or 28b to be made to correspond to the determined ON/OFF state (subroutine called from step S49), target semiconductor switches to be turned on or off among the semiconductor switches 21a and 21b, 22a and 22b, . . . , 28a and 28b included in the capacitance elements 31, 32, . . . , 38 are cyclically switched. As a result, since heat generated by the switching loss is distributed to the semiconductor switches 21a and 21b, 22a and 22b, . . . , 28a and 28b, temperature rise of each semiconductor switch can be suppressed. Therefore, it is possible to suppress a temperature rise due to switching loss of the semiconductor switches 21a and 21b, 22a and 22b, . . . , 28a and 28b.

In addition, according to the first embodiment, in a case where one semiconductor switch 21a or 21b, 22a or 22b, . . . , 28a or 28b of a plurality of (two) semiconductor switches 21a and 21b, 22a and 22b, . . . , 28a and 28b included in the respective capacitance elements 31, 32, . . . , 38 is switched from ON to OFF or from OFF to ON N times (N is an integer of 2 or more) in total, target semiconductor switches to be turned on or off are cyclically switched among the plurality of (two) semiconductor switches included in the same respective capacitance elements 31, 32, . . . , 38. Therefore, the frequency of ON/OFF of each of the plurality of (two) semiconductor switches 21a and 21b, 22a and 22b, . . . , 28a and 28b can be reduced according to the number of semiconductor switches included in each of the capacitance elements 31, 32, . . . , 38.

In addition, according to the first embodiment, in a case where one semiconductor switch 21a or 21b, 22a or 22b, . . . , 28a or 28b of a plurality of (two) semiconductor switches 21a and 21b, 22a and 22b, . . . , 28a and 28b included in the respective capacitance elements 31, 32, . . . , 38 is switched from ON to OFF or from OFF to ON for a predetermined time, target semiconductor switches to be turned on or off are cyclically switched among the plurality of (two) semiconductor switches included in the same respective capacitance elements 31, 32, . . . , 38. Therefore, the frequency of ON/OFF of each of the plurality of (two) semiconductor switches 21a and 21b, 22a and 22b, . . . , 28a and 28b can be reduced according to the number of semiconductor switches included in each of the capacitance elements 31, 32, . . . , 38.

In addition, according to the first embodiment, the capacitances of the capacitors 11a and 11b, 12a and 12b, . . . , 18a and 18b included in the capacitance elements 31, 32, . . . , 38 are the same. The control unit 3 causes one semiconductor switch 21a or 21b, 22a or 22b, . . . , 28a or 28b to be switched from OFF to ON and then switched from ON to OFF in a state in which both of the plurality of (two) semiconductor switches 21a and 21b, 22a and 22b, . . . , 28a and 28b are turned off. Therefore, the capacitance of each of the capacitance elements 31, 32, . . . , 38 viewed from the outside can be set to 0 or set to be the same as the capacitance of each of the capacitors 11a, 12a, . . . , 18a.

In addition, according to the first embodiment, at least some of the capacitors 11a and 11b, 12a and 12b, . . . , 18a and 18b included in the variable capacitor 1 have stepwise different capacitances. Therefore, the adjustment range of the capacitance based on the combination of the capacitors 11a or 11b, 12a or 12b, . . . , 18a or 18b connected in parallel can be made relatively large.

In addition, according to the first embodiment, by reducing the number of semiconductor switches for some or all of the capacitance elements that include capacitors having large capacitances and are less frequently incorporated into the variable capacitor 1, the total number of semiconductor switches can be minimized.

Second Embodiment

In the first embodiment, eight capacitance elements (corresponding to the first capacitance elements) in which two series circuits, each of which includes a capacitor and a semiconductor switch, are connected in parallel are connected in parallel. On the other hand, in a second embodiment, eight capacitance elements (corresponding to second capacitance elements) in which a capacitor and two semiconductor switches connected in parallel are connected in series are connected in parallel. Since the block configuration of an impedance matching device according to the second embodiment is the same as that in the case of the first embodiment, the corresponding portions are denoted by the same reference numerals, and the description thereof will be omitted.

Figure 11:
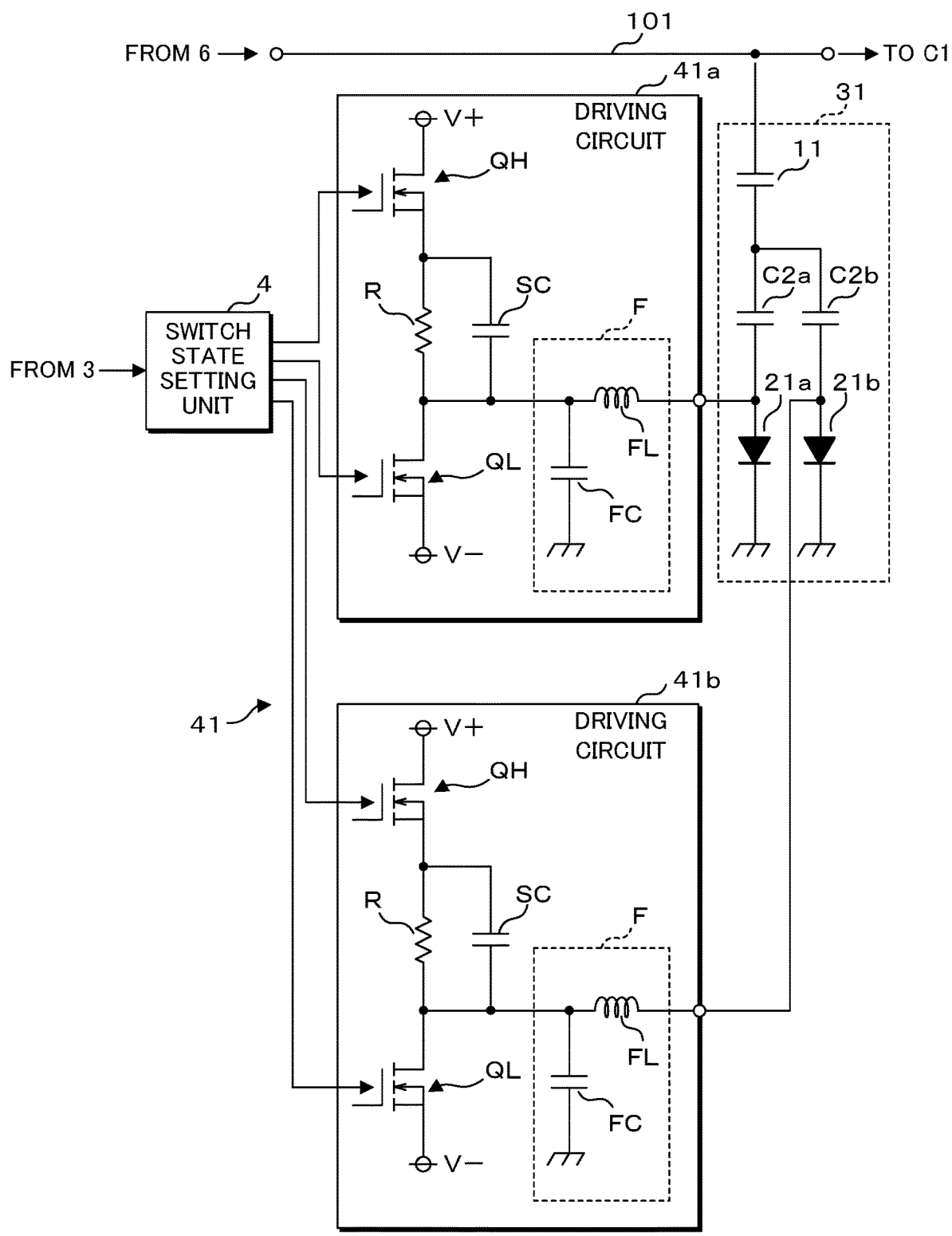
FIG. 11 is a circuit diagram illustrating an example of the configuration of a capacitance element and a driving circuit in an impedance matching device according to a second embodiment.

FIG. 11 is a circuit diagram illustrating an example of the configuration of a capacitance element 31 and a driving circuit 41 in an impedance matching device 100 according to the second embodiment. The capacitance element 31 includes a capacitor 11, which has one end connected to the transmission line 101, and semiconductor switches 21a and 21b each of which is a PIN diode having a cathode connected to the ground potential. Anodes of the semiconductor switches 21a and 21b are connected to the other end of the capacitor 11 through capacitors C2a and C2b, respectively. The capacitances of the capacitors C2a and C2b are sufficiently larger than the capacitance of the capacitor 11 so that the combined capacitance of each of the capacitors C2a and C2b and the capacitor 11 is as close as possible to the capacitance of the capacitor 11. Since the capacitors C2a and C2b cut off DC components of the voltage applied to the semiconductor switches 21a and 21b, either one of the capacitors C2a and C2b may be replaced with a conducting wire.

The configurations of the other capacitance elements 32, 33, . . . , 38 are the same as those described above except that capacitors 12, 13, . . . , 18 are included and semiconductor switches 22a and 22b, 23a and 23b, . . . , 28a and 28b are included inside the capacitance elements. The number of semiconductor switches included in one capacitance element is not limited to two, and may be three or more. In addition, the number of semiconductor switches 21a and 21b, 22a and 22b, . . . , 28a and 28b included in the respective capacitance elements 31, 32, . . . , 38 is not limited to a predetermined number (here, two). The configuration of the driving circuit 41 and the configurations of the other driving circuits 42, 43, . . . , 48 are the same as those in the first embodiment, including the operation content.

In the above-described configuration, as in the case of the first embodiment, the semiconductor switches 21a and 21b are controlled so that both are not turned on at the same time. Specifically, both the semiconductor switches 21a and 21b are basically OFF, and either one of the semiconductor switches 21a and 21b is controlled from OFF to ON or from ON to OFF. In this manner, the incorporation of either one of the capacitors 11a and 11b into the variable capacitor 1 is controlled. Therefore, the operation of the control unit 3 that controls the driving circuit 41 through the switch state setting unit 4 is completely the same as that in the case of the first embodiment, and the content described with reference to FIGS. 3 to 10 is applied to the second embodiment as it is.

As described above, according to the second embodiment, eight capacitance elements of the capacitance element 31 in which the capacitor 11 and the two semiconductor switches 21a and 21b connected in parallel are connected in series, the capacitance element 32 including the capacitor 12 and the semiconductor switches 22a and 22b configured similarly to those described above, . . . , and the capacitance element 38 are connected in parallel. The control unit 3 causes one semiconductor switch 21a or 21b, 22a or 22b, . . . , 28a or 28b to be switched from OFF to ON and then switched from ON to OFF in a state in which both of the plurality of (two) semiconductor switches 21a and 21b, 22a and 22b, . . . , 28a and 28b are turned off. Therefore, the capacitance of each of the capacitance elements 31, 32, . . . , 38 viewed from the outside can be set to 0 or set to be the same as the capacitance of each of the capacitors 11, 12, . . . , 18.

Third Embodiment

In the second embodiment, eight capacitance elements in which a capacitor and two semiconductor switches connected in parallel are connected in series are connected in parallel. On the other hand, in a third embodiment, eight capacitance elements (corresponding to second capacitance elements) in which a capacitor and two semiconductor switches connected in series are connected in series are connected in parallel. Since the block configuration of an impedance matching device according to the third embodiment is the same as that in the case of the first embodiment, the corresponding portions are denoted by the same reference numerals, and the description thereof will be omitted.

Figure 12:
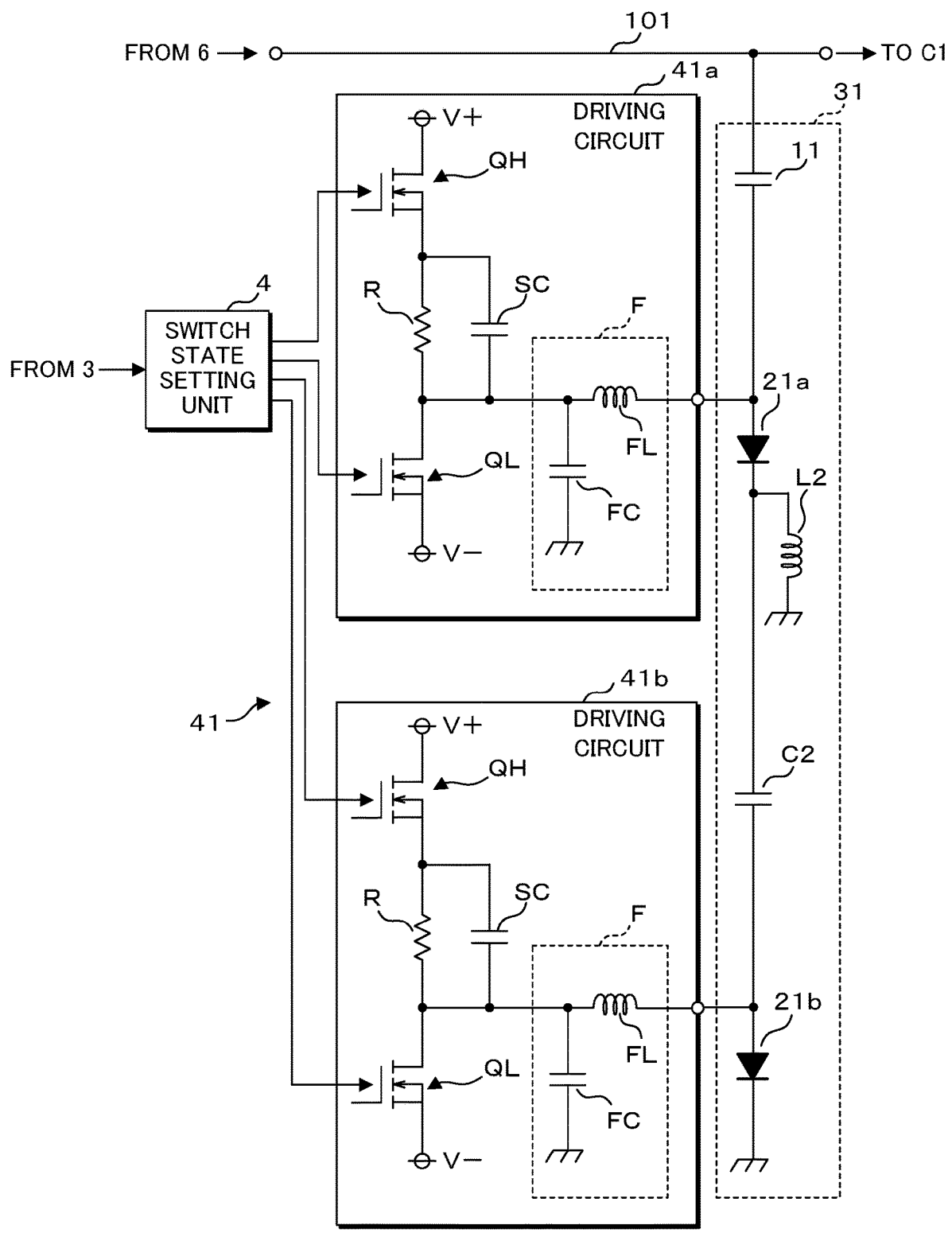
FIG. 12 is a circuit diagram illustrating an example of the configuration of a capacitance element and a driving circuit in an impedance matching device according to a third embodiment.

FIG. 12 is a circuit diagram illustrating an example of the configuration of a capacitance element 31 and a driving circuit 41 in an impedance matching device 100 according to the third embodiment. The capacitance element 31 includes a capacitor 11, which has one end connected to the transmission line 101, and semiconductor switches 21a and 21b that are PIN diodes connected in series through a capacitor C2. The anode of the semiconductor switch 21a is connected to the other end of the capacitor 11. The cathode of the semiconductor switch 21b is connected to the ground potential. A connection point between the cathode of the semiconductor switch 21a and the capacitor C2 is connected to the ground potential through an inductor L2 that is a choke coil for cutting off AC components. The capacitance of the capacitor C2 is sufficiently larger than the capacitance of the capacitor 11 so that the combined capacitance of the capacitor C2 and the capacitor 11 is as close as possible to the capacitance of the capacitor 11.

The configurations of the other capacitance elements 32, 33, . . . , 38 are the same as those described above except that capacitors 12, 13, . . . , 18 are included and semiconductor switches 22a and 22b, 23a and 23b, . . . , 28a and 28b are included inside the capacitance elements. The number of semiconductor switches included in one capacitance element is not limited to two, and may be three or more. In addition, the number of semiconductor switches 21a and 21b, 22a and 22b, . . . , 28a and 28b included in the respective capacitance elements 31, 32, . . . , 38 is not limited to a predetermined number (here, two). The configuration of the driving circuit 41 and the configurations of the other driving circuits 42, 43, . . . , 48 are the same as those in the first embodiment, including the operation content.

In the above-described configuration, unlike in the cases of the first and second embodiments, the semiconductor switches 21a and 21b are controlled so that both are not turned off at the same time. Specifically, both the semiconductor switches 21a and 21b are basically ON, and either one of the semiconductor switches 21a and 21b is controlled from ON to OFF or from OFF to ON. In this manner, the incorporation of the capacitor 11 into the variable capacitor 1 is controlled. The operation of the control unit 3 that controls the driving circuit 41 through the switch state setting unit 4 is completely the same as that in the case of the first embodiment until immediately before executing the subroutine relevant to switch switching (immediately before step S48 in FIG. 6), and the content described with reference to FIGS. 3 to 6 is applied to the third embodiment as it is.

FIG. 13 is a timing chart showing ON/OFF operations of the semiconductor switches 21a and 21b in the impedance matching device 100 according to the third embodiment. The timing chart shown in FIG. 13 is different from the timing chart shown in FIG. 7 of the first embodiment in terms of the change mode of the ON/OFF states of the first switch and the second switch. Since the impedance update period, the impedance matching calculation, and the number of ON/OFF times of the first switch and the second switch are the same as those shown in FIG. 7, other detailed description regarding the diagrams will be omitted.

In the example shown in FIG. 13, when the number of ON/OFF times of the first switch or the second switch becomes 4 (4 is not shown), target switches to be turned on or off are cyclically switched. Specifically, when the second switch is controlled from OFF to ON at time t11 and accordingly the number of ON/OFF times is changed from 3 to 4, target switches to be turned on or off are cyclically switched from the second switch to the first switch. At this point in time, there is no change in the state of the first switch. The second switch that is not a target switch to be turned on or off maintains the ON state. Then, whenever the impedance is updated and ON/OFF of the semiconductor switch 21 needs to be switched, the first switch is controlled from ON to OFF or from OFF to ON, and each time the number of ON/OFF times of the first switch is counted up.

When the first switch is controlled from OFF to ON at time t12 and accordingly the number of ON/OFF times is changed from 3 to 4, target switches to be turned on or off are cyclically switched from the first switch to the second switch. At this point in time, there is no change in the state of the second switch. The first switch that is not a target switch to be turned on or off maintains the ON state. Then, whenever the impedance is updated and ON/OFF of the semiconductor switch 21 needs to be switched, the second switch is controlled from ON to OFF or from OFF to ON, and each time the number of ON/OFF times of the second switch is counted up. Similarly hereinafter, target switches to be turned on or off are cyclically switched to the first switch at time t13 and cyclically switched from the first switch to the second switch at time t14.

If the change mode of the ON/OFF states of the first switch and the second switch in FIG. 13 is compared with that shown in FIG. 7 of the first embodiment, it can be said that the change from ON to OFF and the change from OFF to ON in FIG. 7 are replaced with a change from OFF to ON and a change from ON to OFF in FIG. 13. In other words, the processes illustrated in FIGS. 9 and 10 can also be applied to the third embodiment by replacing "ON" with "OFF" and "OFF" with "ON" in the processes illustrated in FIGS. 9 and 10 of the first embodiment.

More specifically, in FIG. 9, it is "determined whether or not the semiconductor switch corresponding to the switch number Sk is OFF" in step S65, "the semiconductor switch corresponding to Sk is turned on" in step S66, and "the semiconductor switch corresponding to new Sk is turned off" in step S70. In addition, in FIG. 10, it is "determined whether or not the semiconductor switch corresponding to the switch number Sk is OFF" in step S82, "the semiconductor switch corresponding to Sk is turned on" in step S83, and "the semiconductor switch corresponding to new Sk is turned off" in step S85.

As described above, according to the third embodiment, eight capacitance elements of the capacitance element 31 in which the capacitor 11 and the two semiconductor switches 21a and 21b connected in series are connected in series, the capacitance element 32 including the capacitor 12 and the semiconductor switches 22a and 22b configured similarly to those described above, . . . , and the capacitance element 38 are connected in parallel. The control unit 3 causes one semiconductor switch 21a or 21b, 22a or 22b, . . . , 28a or 28b to be switched from ON to OFF and then switched from OFF to ON in a state in which both of the plurality of (two) semiconductor switches 21a and 21b, 22a and 22b, . . . , 28a and 28b are turned on. Therefore, the capacitance of each of the capacitance elements 31, 32, . . . , 38 viewed from the outside can be set to 0 or set to be the same as the capacitance of each of the capacitors 11, 12, . . . , 18.

In addition, one capacitor and a plurality of semiconductor switches connected in parallel are connected in series to form one capacitance element in the second embodiment, and one capacitor and a plurality of semiconductor switches connected in series are connected in series to form one capacitance element in the third embodiment, but these may be combined. Specifically, a parallel circuit of a plurality of semiconductor switches connected in parallel and a plurality of semiconductor switches connected in series may be connected in series with one capacitor to form one capacitance element. In this case, for example, semiconductor switches to be turned on or off among the plurality of semiconductor switches connected in parallel may be cyclically switched and then, when this cyclic switching is completed, semiconductor switches to be turned on or off among the plurality of semiconductor switches connected in series may be cyclically switched, and these may be repeated.

It is to be noted that, as used herein and in the appended claims, the singular forms "a", "an", and "the" include plural referents unless the context clearly dictates otherwise.

The embodiments disclosed this time are to be considered in all respects as illustrative and not restrictive. The scope of the invention is indicated not by the meaning described above but by the scope of the claims, and includes all changes within the meaning and scope equivalent to the scope of the claims. In addition, the technical features described in the respective embodiments can be combined with each other.

What is claimed is:

1. An impedance matching device for achieving impedance matching between a high frequency power supply and a load, the device comprising:
    a variable capacitor in which a plurality of first capacitance elements are connected in parallel, each of the plurality of capacitance elements including a plurality of series circuits each having a capacitor and a semiconductor switch;
    a calculation unit coupled to an impedance information detection unit located between the high frequency power supply and the impedance matching device to calculate an impedance information or a reflection coefficient on a load side of the load; and
    a control unit coupled to the calculation unit to determine an ON/OFF state of the semiconductor switches using the impedance information or the reflection coefficient calculated by the calculation unit to generate control signals to control the semiconductor switches by turning on or off the semiconductor switches,
    wherein the control signals cyclically switch the semiconductor switches turning on or off the semiconductor switches in a predetermined order until the impedance matching is achieved.

2. The impedance matching device according to claim 1, wherein the control unit cyclically switches semiconductor switches to be turned on or off each time one semiconductor switch is turned on or off N (N is an integer of 2 or more) times.

3. The impedance matching device according to claim 1, wherein the control unit cyclically switches semiconductor switches to be turned on or off each time one semiconductor switch is turned on or off for a predetermined time.

4. The impedance matching device according to claim 1, wherein the plurality of capacitors have the same capacitance, and
    the control unit controls one semiconductor switch from OFF to ON and then from ON to OFF in a state in which the plurality of semiconductor switches are controlled to be OFF so as to turn on only one of the plurality of semiconductor switches.

5. The impedance matching device according to claim 1, wherein some or all of the capacitors included in the variable capacitor have stepwise different capacitances.

6. The impedance matching device according to claim 5, wherein some or all of the capacitance elements have a smaller number of semiconductor switches as a capacitance of the capacitor included in each of the capacitance elements is made larger.

7. An impedance matching method for performing impedance matching between a high frequency power supply and a load using a variable capacitor which is provided between the high frequency power supply and the load,
    wherein in the variable capacitor, a plurality of capacitance elements are connected in parallel, each of the plurality of capacitance elements including a plurality of series circuits each having a capacitor and a semiconductor switch, the method comprising:

calculating an impedance information or a reflection coefficient on a load side of the load;

determining an ON/OFF state of the semiconductor switches using the calculated impedance information or reflection coefficient to generate control signals to control the semiconductor switches by turning on or off the semiconductor switches; and cyclically switching the semiconductor switches by turning on or off the semiconductor switches in a predetermined order until the impedance matching is achieved.

8. An impedance matching device for achieving impedance matching between a high frequency power supply and a load, the device comprising:

a variable capacitor in which a plurality of capacitance elements are connected in parallel, each of the plurality of capacitance elements including a circuit having a capacitor and a plurality of semiconductor switches connected in series or parallel;

a calculation unit coupled to an impedance information detection unit located between the high frequency power supply and the impedance matching device to calculate an impedance information or a reflection coefficient on a load side of the load; and a control unit coupled to the calculation unit to determine an ON/OFF state of the semiconductor switches using the impedance information or the reflection coefficient calculated by the calculation unit to generate control signals to control the semiconductor switches by turning on or off the semiconductor switches, wherein the control signals cyclically switch the semiconductor switches by turning on or off the semiconductor switches in a predetermined order until the impedance matching is achieved.

9. The impedance matching device according to claim 8, wherein the control unit cyclically switches semiconductor switches to be turned on or off each time one semiconductor switch is turned on or off N (N is an integer of 2 or more) times.

10. The impedance matching device according to claim 8, wherein the control unit cyclically switches semiconductor switches to be turned on or off each time one semiconductor switch is turned on or off for a predetermined time.

11. The impedance matching device according to claim 8, wherein all of the plurality of semiconductor switches are connected in parallel, and the control unit controls one semiconductor switch from OFF to ON and then from ON to OFF in a state in which the plurality of semiconductor switches are controlled to be OFF so as to turn on only one of the plurality of semiconductor switches.

12. The impedance matching device according to claim 8, wherein all of the plurality of semiconductor switches are connected in series, and the control unit controls one semiconductor switch from ON to OFF and then from OFF to ON in a state in which the plurality of semiconductor switches are controlled to be ON so as to turn off only one of the plurality of semiconductor switches.

13. The impedance matching device according to claim 8, wherein some or all of the capacitors included in the variable capacitor have stepwise different capacitances.

14. The impedance matching device according to claim 13, wherein some or all of the capacitance elements have a smaller number of semiconductor switches as a capacitance of the capacitor included in each of the capacitance elements is made larger.

15. An impedance matching method for performing impedance matching between a high frequency power supply and a load using a variable capacitor which is provided between the high frequency power supply and the load, wherein in the variable capacitor, a plurality of capacitance elements are connected in parallel, each of the plurality of capacitance elements including a circuit having a capacitor and a plurality of semiconductor switches connected in series or parallel, the method comprising:

calculating an impedance information or a reflection coefficient on a load side of the load;

determining an ON/OFF state of the semiconductor switches using the calculated impedance information or reflection coefficient to generate control signals to control the semiconductor switches by turning on or off the semiconductor switches; and cyclically switching the semiconductor switches by turning on or off the semiconductor switches in a predetermined order until the impedance matching is achieved.

* * * * *

UNITED STATES PATENT AND TRADEMARK OFFICE
CERTIFICATE OF CORRECTION

PATENT NO. : 11,101,109 B2  
APPLICATION NO. : 16/722731  
DATED : August 24, 2021  
INVENTOR(S) : Tatsuya Morii Page 1 of 1

It is certified that error appears in the above-identified patent and that said Letters Patent is hereby corrected as shown below:

In the Specification

Please replace "full y" with -- fully -- (Column 4, Lines 59-60);

Please replace "n type" with -- $\pi$ type -- (Column 6, Line 61); and

Please replace "to" with -- t0 -- (Column 10, Line 28).

In the Claims

Please delete "first" in Claim 1 (Column 22, Line 16); and

Please replace "switches turning" with -- switches by turning -- in Claim 1 (Column 22, Line 33).

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*